United States Patent
Sei et al.

(10) Patent No.: US 10,879,312 B2
(45) Date of Patent: Dec. 29, 2020

(54) MEMORY DEVICE AND MEMORY UNIT

(71) Applicant: SONY CORPORATION, Tokyo (JP)

(72) Inventors: Hiroaki Sei, Kanagawa (JP); Kazuhiro Ohba, Tokyo (JP); Seiji Nonoguchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/536,180

(22) Filed: Aug. 8, 2019

(65) Prior Publication Data

US 2019/0371859 A1 Dec. 5, 2019

Related U.S. Application Data

(63) Continuation of application No. 14/653,828, filed as application No. PCT/JP2013/083029 on Dec. 10, 2013, now Pat. No. 10,418,416.

(30) Foreign Application Priority Data

Dec. 25, 2012 (JP) .................................. 2012-281395
Jul. 26, 2013 (JP) .................................. 2013-156038
Nov. 5, 2013 (JP) .................................. 2013-229393

(51) Int. Cl.
*H01L 27/24* (2006.01)
*H01L 45/00* (2006.01)

(52) U.S. Cl.
CPC ...... *H01L 27/2463* (2013.01); *H01L 27/2472* (2013.01); *H01L 45/08* (2013.01);
(Continued)

(58) Field of Classification Search
CPC ........... H01L 45/14; H01L 45/142–148; H01L 45/1253
See application file for complete search history.

(56) References Cited

U.S. PATENT DOCUMENTS

2003/0168673 A1* 9/2003 Yuasa .................... B82Y 10/00
257/200
2009/0039336 A1* 2/2009 Terao .................. G11C 11/5614
257/4
(Continued)

FOREIGN PATENT DOCUMENTS

CN 101552321 A 10/2009
CN 102592656 A 7/2012
(Continued)

OTHER PUBLICATIONS

Office Action for JP Patent Application 2014-554292, dated Aug. 8, 2017, 05 pages of Office Action and 03 pages of English Translation.

(Continued)

*Primary Examiner* — Christine A Enad
(74) *Attorney, Agent, or Firm* — Chip Law Group

(57) ABSTRACT

There are provided a memory device and a memory unit that make it possible to improve retention property of a resistance value in low-current writing. The memory device of the technology includes a first electrode, a memory layer, and a second electrode in order, in which the memory layer includes an ion source layer containing one or more transition metal elements selected from group 4, group 5, and group 6 in periodic table, one or more chalcogen elements selected from tellurium (Te), sulfur (S), and selenium (Se), and one or both of boron (B) and carbon (C), and a resistance change layer having resistance that is varied by voltage application to the first electrode and the second electrode.

14 Claims, 10 Drawing Sheets

(52) U.S. Cl.
CPC ...... *H01L 45/1233* (2013.01); *H01L 45/1253* (2013.01); *H01L 45/1266* (2013.01); *H01L 45/14* (2013.01); *H01L 45/142* (2013.01); *H01L 45/143* (2013.01); *H01L 45/144* (2013.01); *H01L 45/145* (2013.01); *H01L 45/146* (2013.01); *H01L 45/148* (2013.01); *H01L 45/149* (2013.01)

(56) References Cited

U.S. PATENT DOCUMENTS

| | | | |
|---|---|---|---|
| 2009/0242868 | A1 | 10/2009 | Kurotsuchi et al. |
| 2010/0314602 | A1 | 12/2010 | Takano et al. |
| 2011/0068316 | A1 | 3/2011 | Takano et al. |
| 2011/0140065 | A1* | 6/2011 | Maesaka ............ H01L 27/2436 257/2 |
| 2011/0155987 | A1* | 6/2011 | Mizuguchi ........... H01L 45/145 257/2 |
| 2011/0175049 | A1* | 7/2011 | Yasuda ............... H01L 27/2436 257/3 |
| 2011/0233503 | A1 | 9/2011 | Hwang |
| 2011/0309322 | A1 | 12/2011 | Hwang |
| 2012/0161095 | A1* | 6/2012 | Mikawa ................ H01L 27/101 257/4 |
| 2012/0176831 | A1 | 6/2012 | Xiao et al. |
| 2012/0168705 | A1 | 7/2012 | Liu et al. |
| 2012/0182785 | A1 | 7/2012 | Otsuka |
| 2012/0236625 | A1 | 9/2012 | Ohba et al. |
| 2013/0193396 | A1 | 8/2013 | Nakano et al. |
| 2013/0292631 | A1* | 11/2013 | Chin ....................... H01L 45/06 257/4 |
| 2014/0175360 | A1* | 6/2014 | Tendulkar ............. H01L 45/146 257/4 |
| 2014/0213032 | A1* | 7/2014 | Kai ........................ H01L 45/04 438/382 |

FOREIGN PATENT DOCUMENTS

| | | |
|---|---|---|
| CN | 102683348 A | 9/2012 |
| JP | 2005-322942 A | 11/2005 |
| JP | 2006-196537 A | 7/2006 |
| JP | 2009-246085 A | 10/2009 |
| JP | 2012-146368 A | 8/2012 |
| JP | 2012-182172 A | 9/2012 |
| JP | 2012-216725 A | 11/2012 |
| TW | 201001693 A | 1/2010 |

OTHER PUBLICATIONS

Office Action for CN Patent Application 201380066176.0, dated Apr. 27, 2017, 07 pages of Office Action and 08 pages of English Translation.

Waser, et al. "Redox-Based Resistive Switching Memories—Nanoionic Mechanisms, Prospects, and Challenges." 2009 Wiley-VCH Verlag GmbH & Co. KGaA, Weinham. Adv. Mater. 2009, pp. 2632-2663.

Non-Final Office Action for U.S. Appl. No. 14/653,828, dated Dec. 14, 2015, 11 pages.

Non-Final Office Action for U.S. Appl. No. 14/653,828, dated Sep. 28, 2016, 12 pages.

Non-Final Office Action for U.S. Appl. No. 14/653,828, dated Aug. 3, 2017, 13 pages.

Non-Final Office Action for U.S. Appl. No. 14/653,828, dated Jun. 21, 2018, 15 pages.

Final Office Action for U.S. Appl. No. 14/653,828, dated May 20, 2016, 12 pages.

Final Office Action for U.S. Appl. No. 14/653,828, dated Apr. 24, 2017, 13 pages.

Final Office Action for U.S. Appl. No. 14/653,828, dated Feb. 9, 2018, 14 pages.

Final Office Action for U.S. Appl. No. 14/653,828, dated Jan. 31, 2019, 14 pages.

Advisory Action for U.S. Appl. No. 14/653,828, dated Jul. 29, 2016, 03 pages.

Advisory Action for U.S. Appl. No. 14/653,828, dated May 17, 2018, 03 pages.

Notice of Allowance for U.S. Appl. No. 14/653,828, dated May 10, 2019, 08 pages.

International Search Report and Written Opinion of PCT Application No. PCT/JP2013/083029, dated Jan. 14, 2014, 07 pages of English Translation and 07 pages of ISRWO.

International Preliminary Report on Patentability of PCT Application No. PCT/JP2013/083029, dated Jul. 9, 2015, 07 pages of English Translation and 04 pages of IPRP.

* cited by examiner

[FIG. 1]
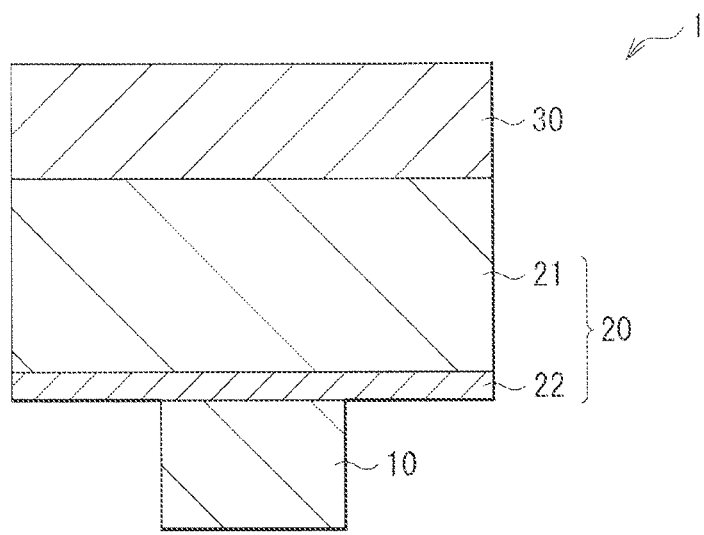

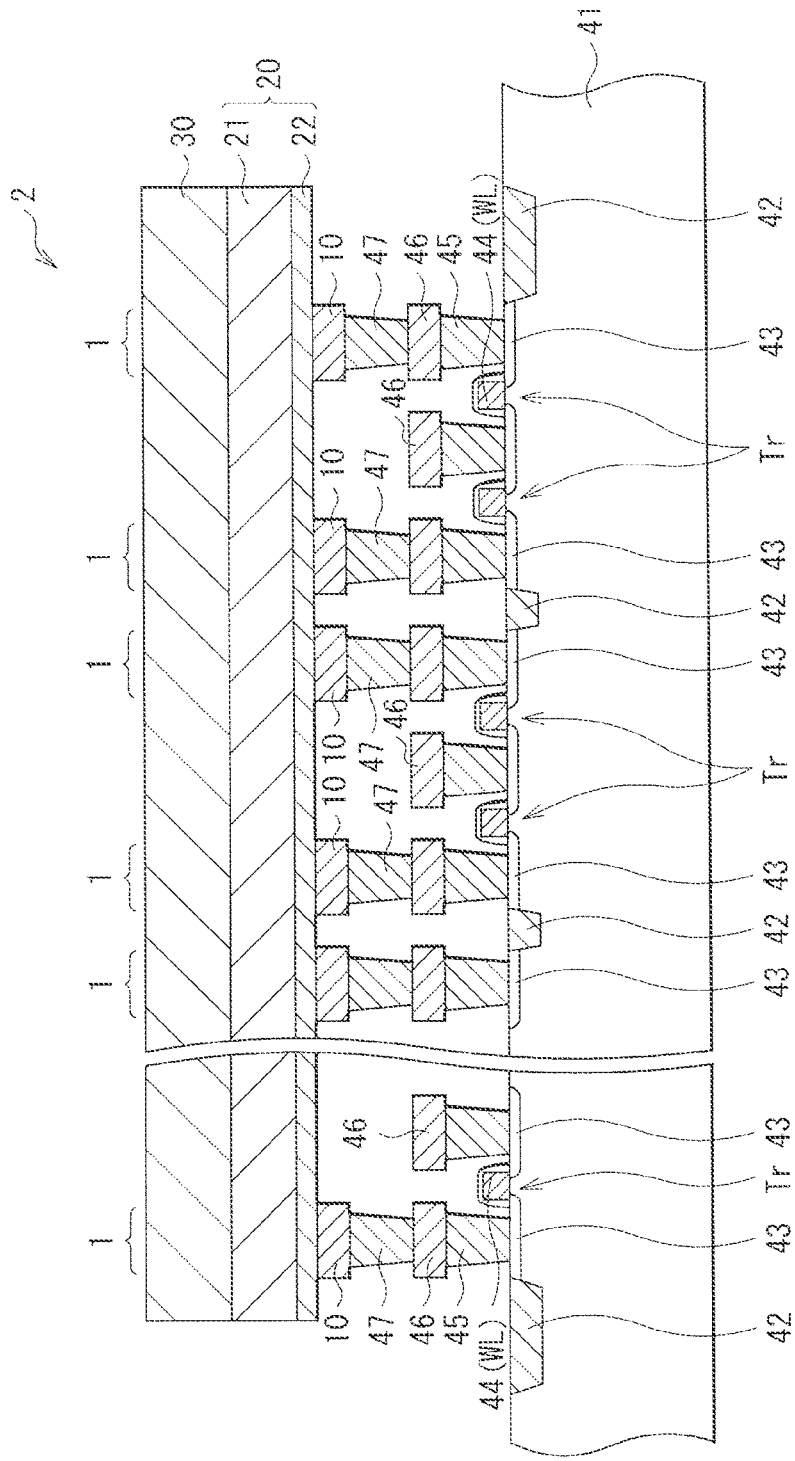
[FIG. 2]

[FIG. 3]
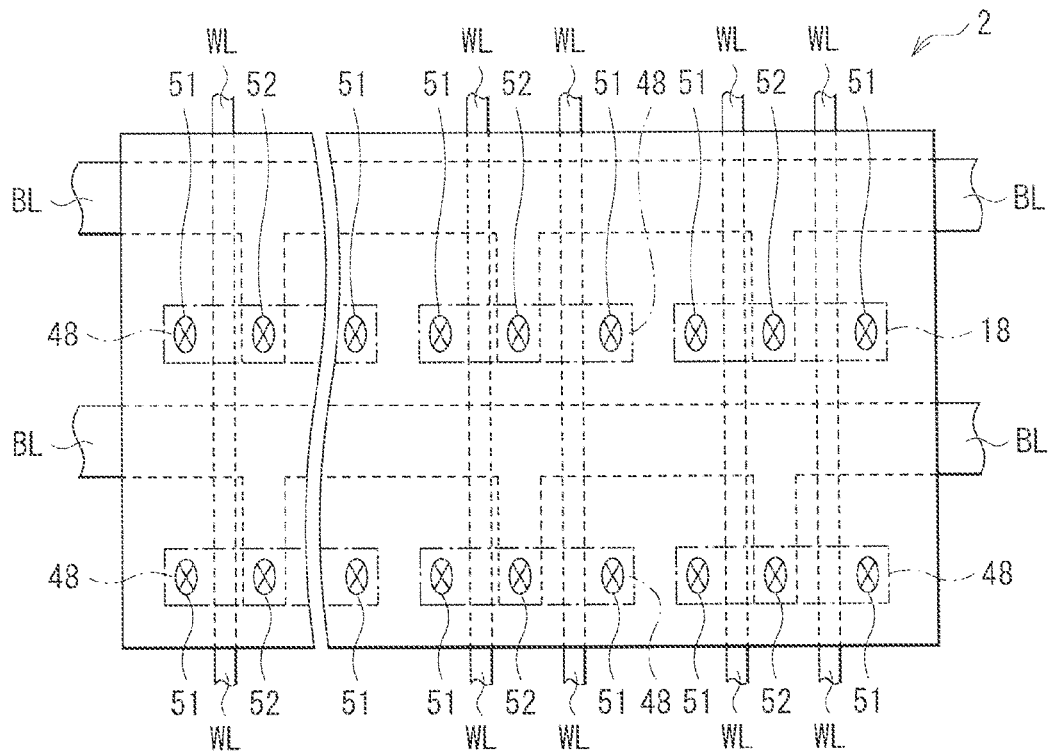
[FIG. 4]
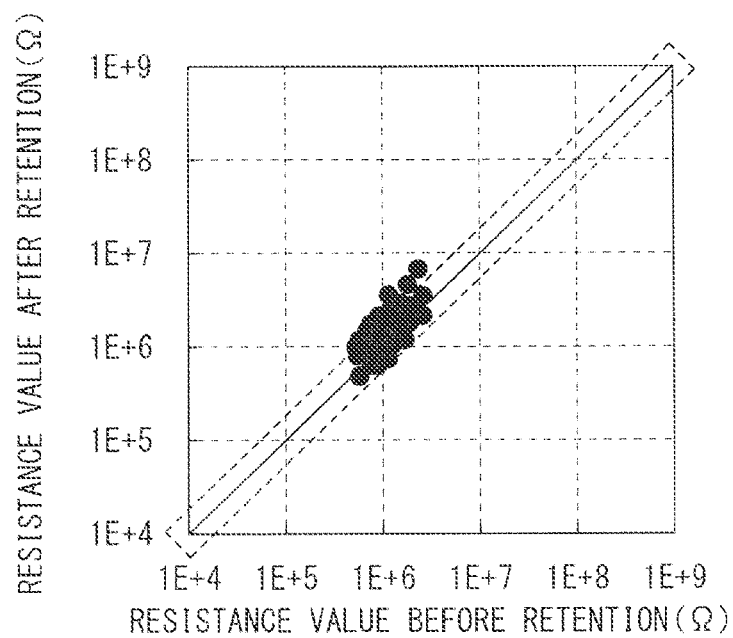

[FIG. 5]
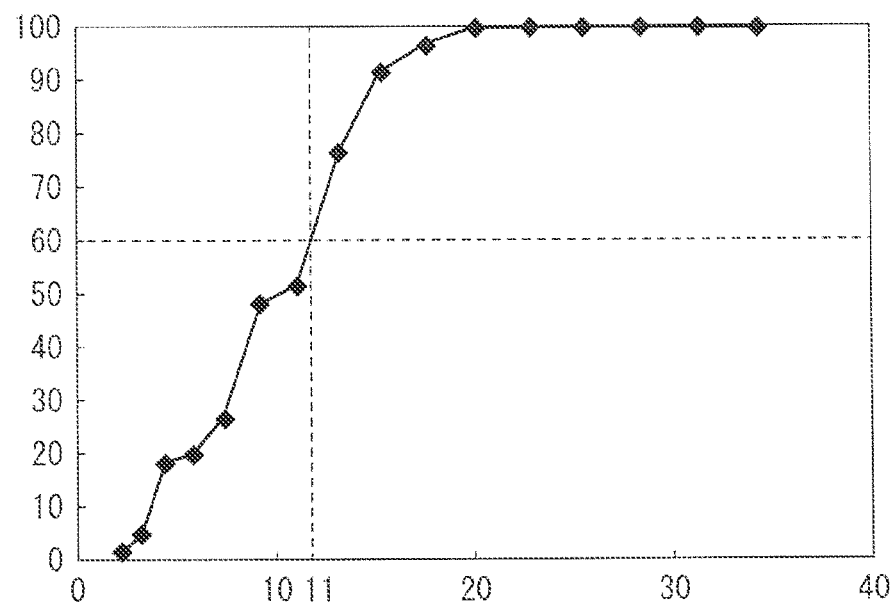
[FIG. 6]
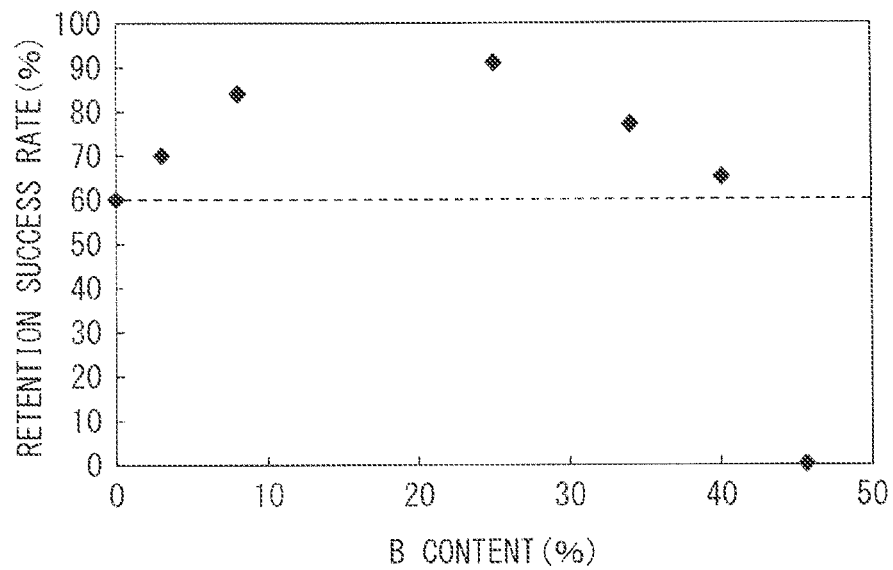

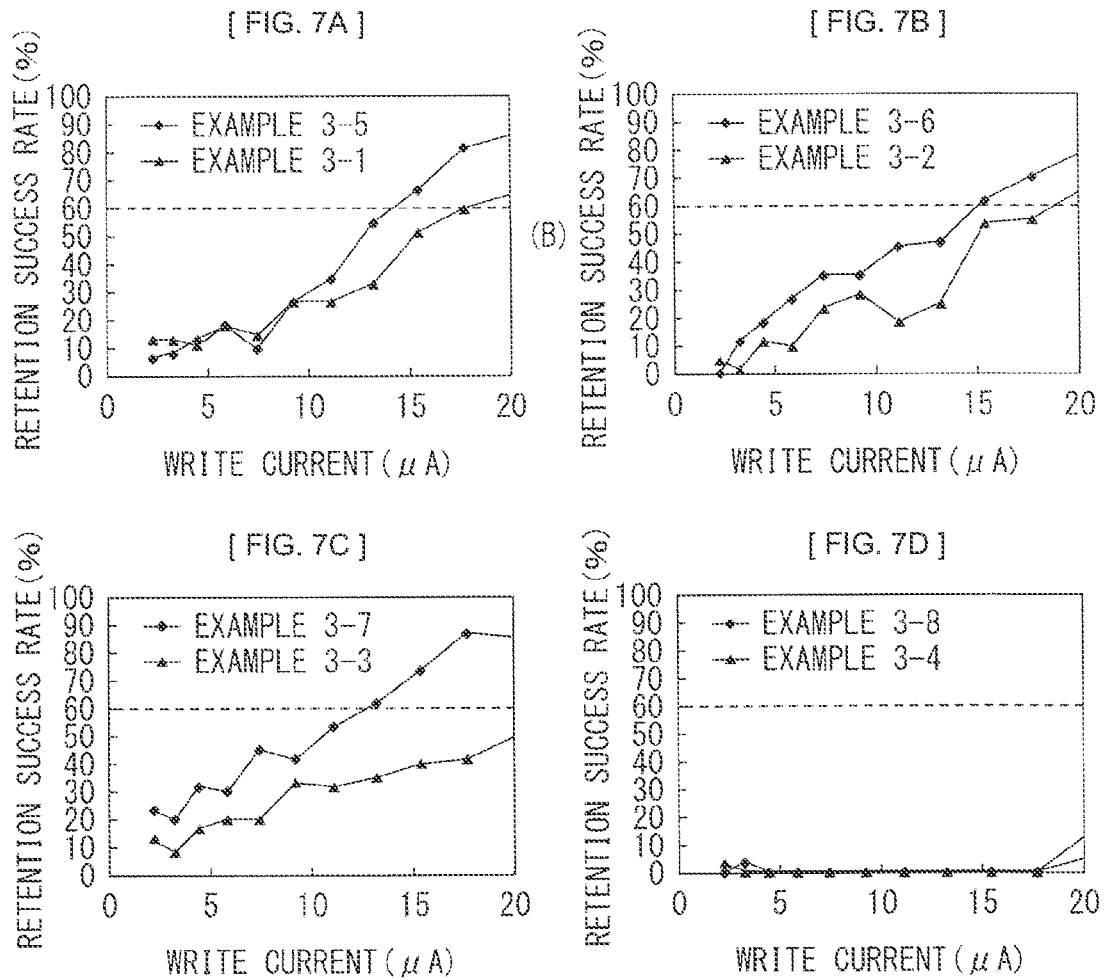

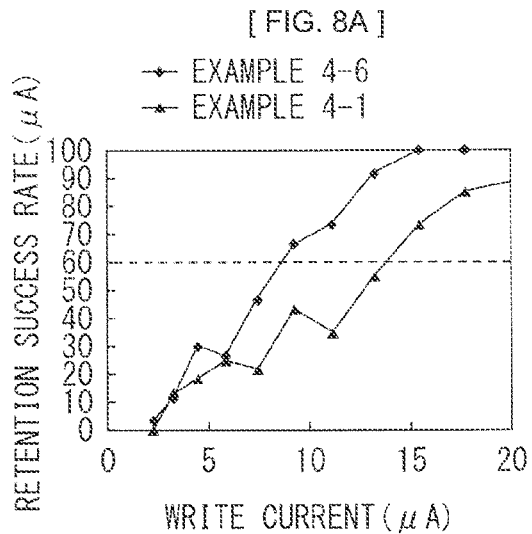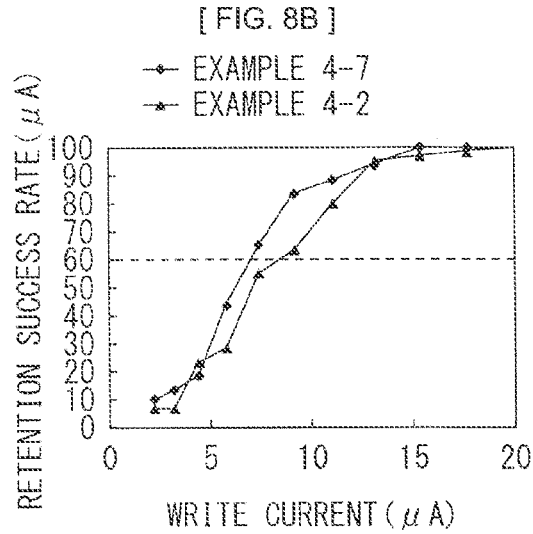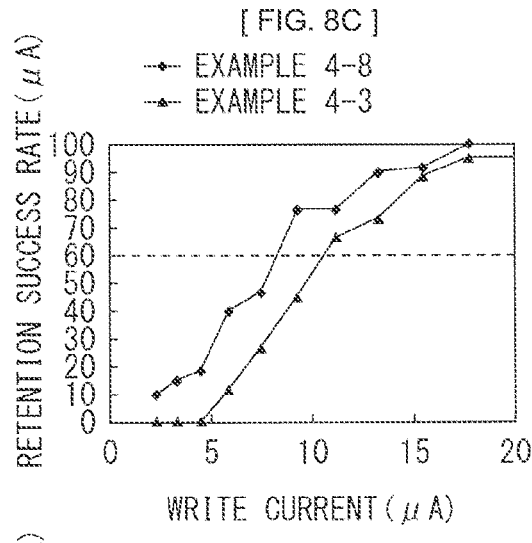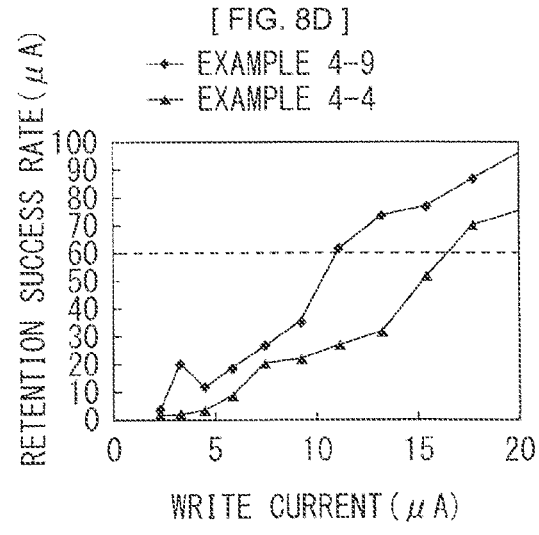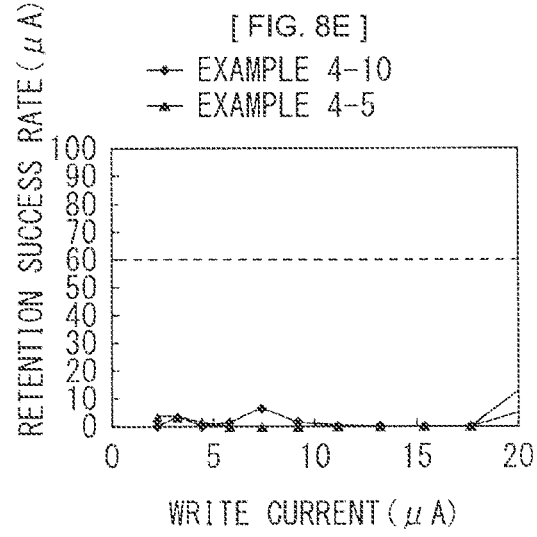

[FIG. 9]
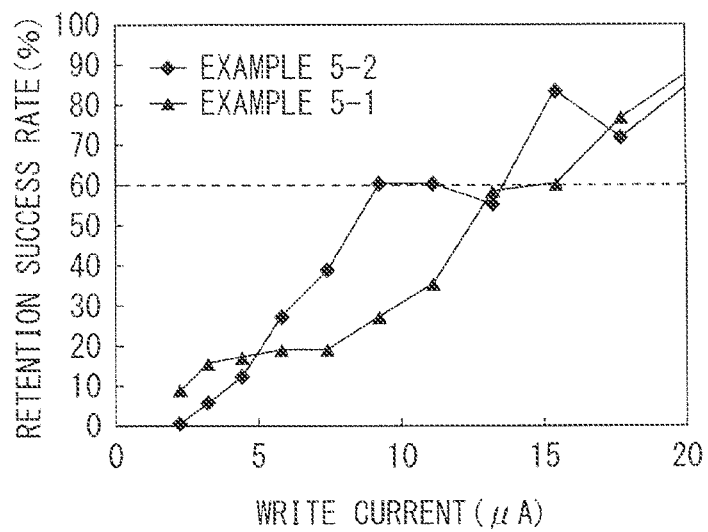
[FIG. 10]
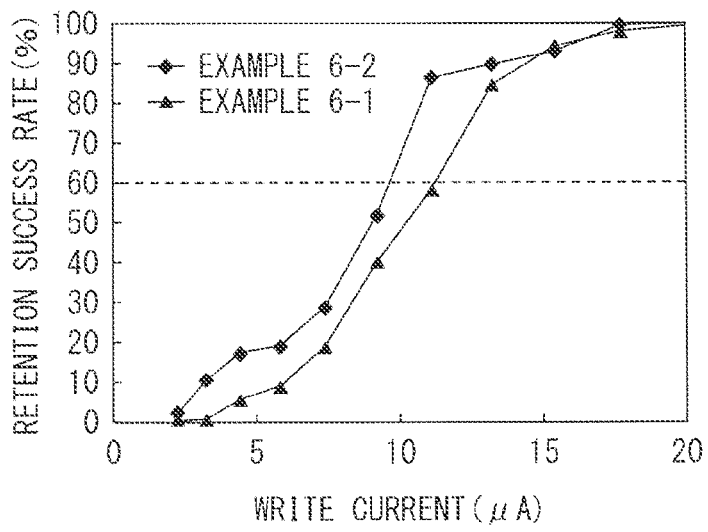

[FIG. 11]
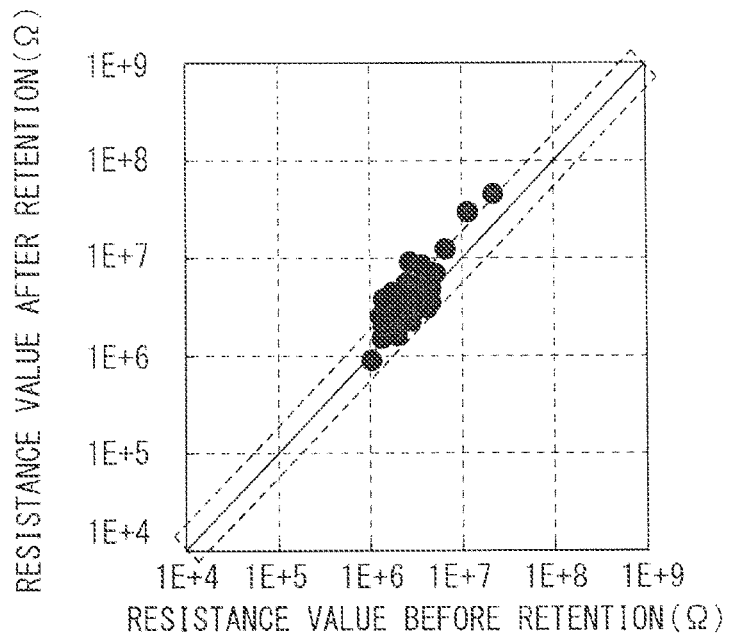
[FIG. 12]
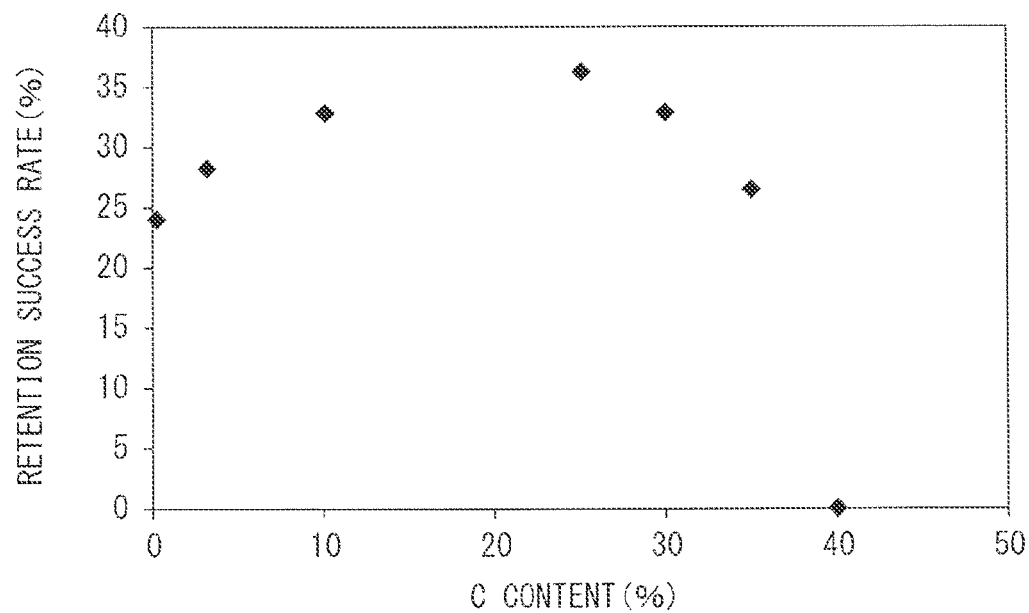

[FIG. 13]
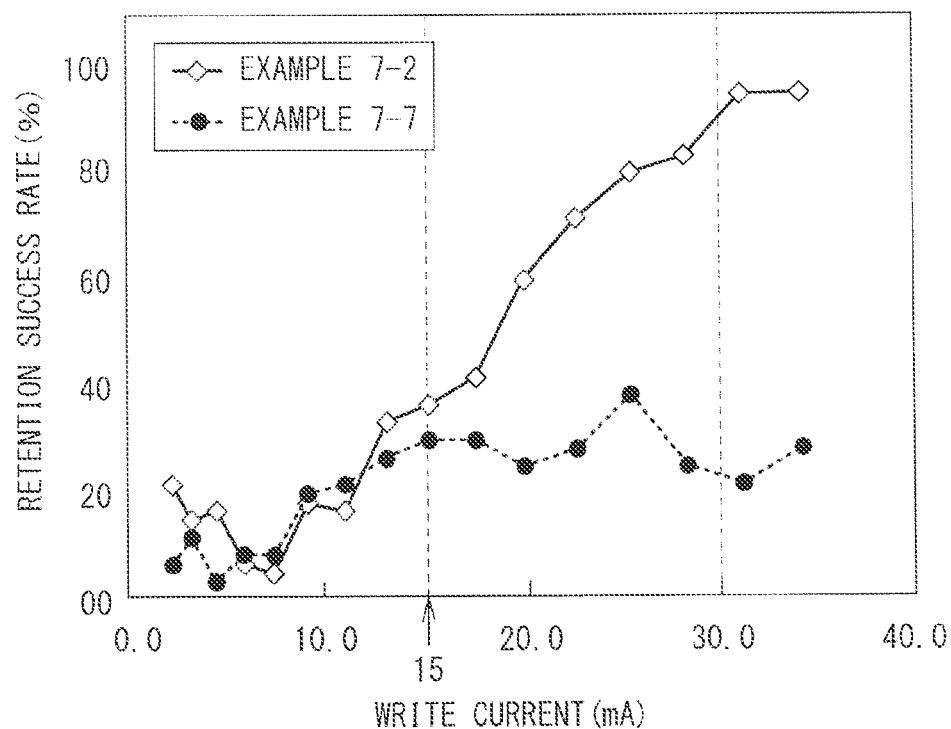
[FIG. 14]
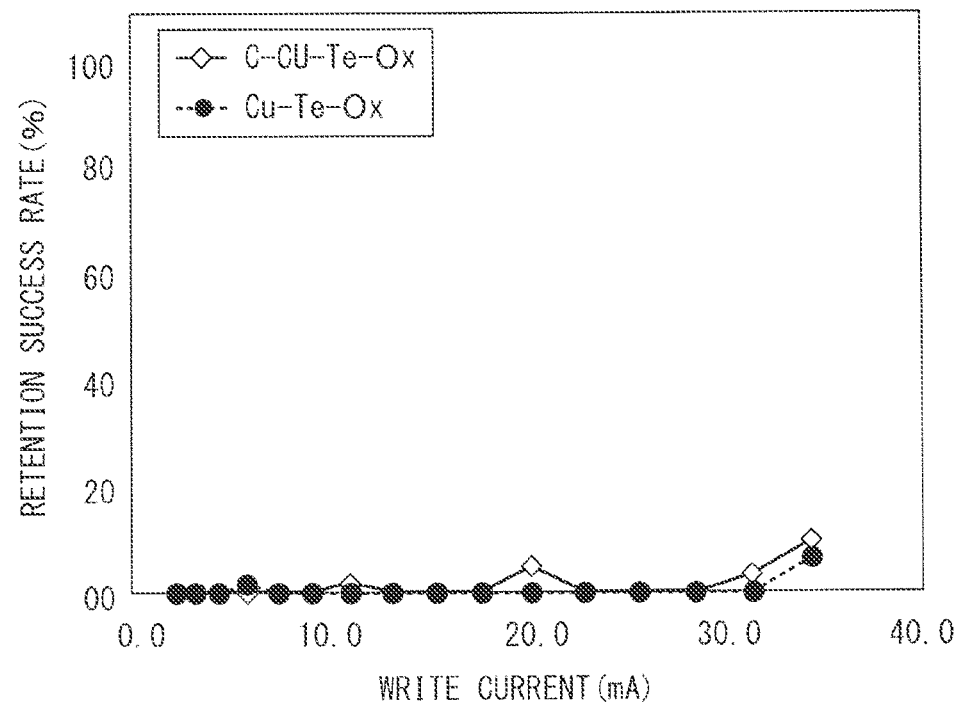

[ FIG. 15 ]
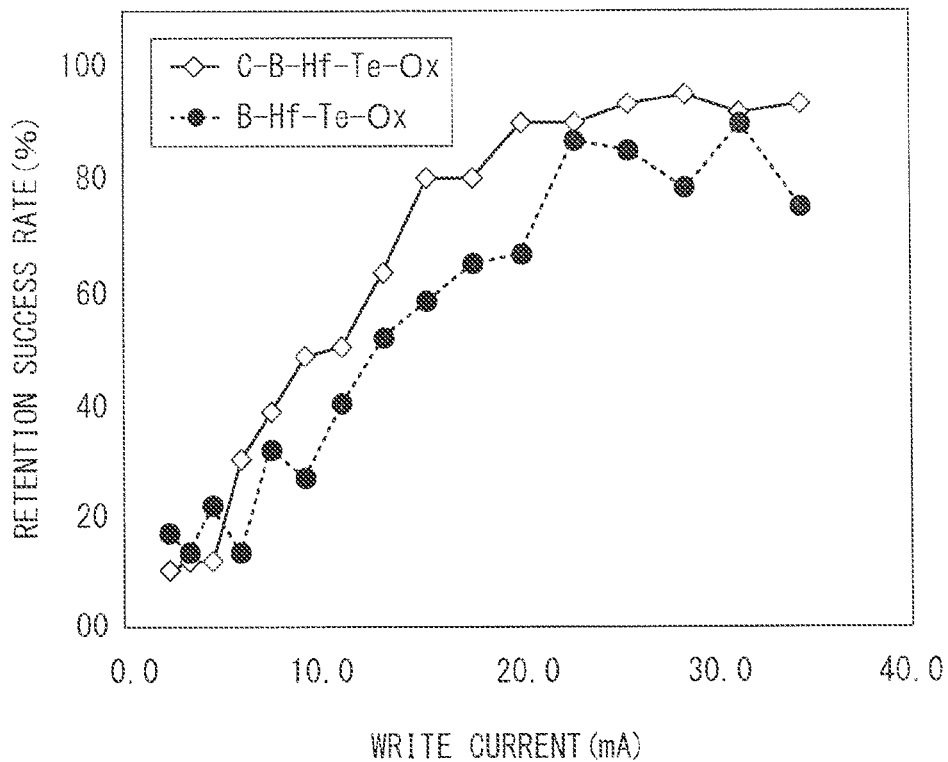
[ FIG. 16 ]
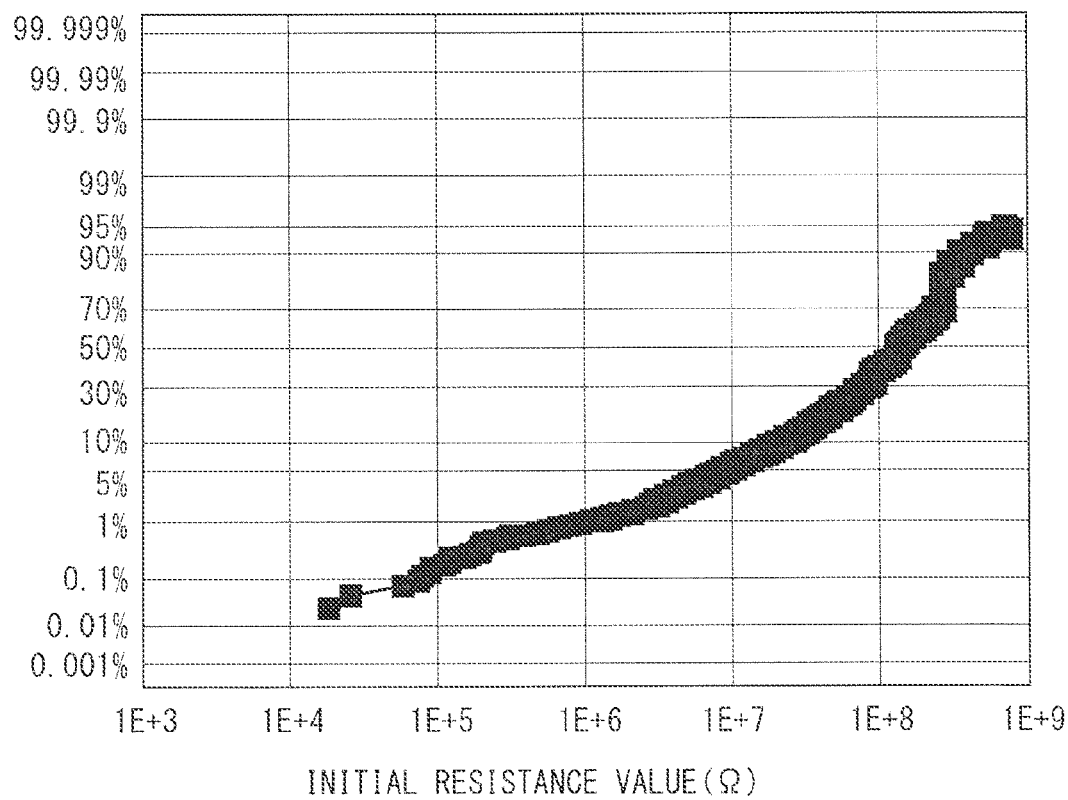

MEMORY DEVICE AND MEMORY UNIT

CROSS REFERENCE TO RELATED APPLICATIONS

This application is a continuation application of U.S. patent application Ser. No. 14/653,828, filed Jun. 18, 2015, which is a U.S. National Phase of International Patent Application No. PCT/JP2013/083029 filed Dec. 10, 2013, which claims priority benefit of Japanese Patent Application No. JP 2013-229393 filed in the Japan Patent Office on Nov. 5, 2013, Japanese Patent Application No. JP 2013-156038 filed in the Japan Patent Office on Jul. 26, 2013, and Japanese Patent Application No. JP 2012-281395 filed in the Japan Patent Office on Dec. 25, 2012. Each of the above-referenced applications is hereby incorporated herein by reference in its entirety.

TECHNICAL FIELD

The disclosure relates to a memory device and a memory unit that store therein information with use of variation of electric characteristics of a memory layer including an ion source layer.

BACKGROUND ART

As a semiconductor non-volatile memory for data storage, NOR flash memory or NAND flash memory is typically used. In these semiconductor non-volatile memories, large capacity is realized by miniaturization of a memory device and a drive transistor. However, limit of the miniaturization is pointed out because a large voltage is necessary for writing and erasing and the number of electrons injected into a floating gate is restricted.

A variable resistance memory such as resistance random access memory (ReRAM) and phase-change random access memory (PRAM) has been currently proposed as a next-generation non-volatile memory that may exceed limit of miniaturization (for example, see PTL 1 and NFL 1). Each of these memories has a simple structure including a resistance change layer between two electrodes. It is considered that atoms or ions are moved by heat or an electric field to form a conduction path, and thus a resistance value of a resistance change layer is varied to perform writing and erasing. Specifically, a memory device that uses a transition metal element, a chalcogen element, and copper (Cu) easily causing ion conduction has been disclosed (for example, see PTL 2).

As described above, examples of a method of achieving large capacity in a memory performing writing and erasing with use of resistance variation include miniaturization of a memory described above.

CITATION LIST

Patent Literature

PTL 1: Japanese Unexamined Patent Application Publication No. 2006-196537
PTL 2: Japanese Unexamined Patent Application Publication No. 2005-322942

Non Patent Literature

NPL 1: Waser, et al., Advanced Material, 21 p 2932 (2009)

SUMMARY OF INVENTION

However, in the miniaturized memory, a drive current of a transistor is decreased. Therefore, a current for writing (write current) is decreased as the memory is miniaturized. Thus, a resistance value in a low resistance state is disadvantageously increased and it is difficult to retain the resistance value.

Therefore, it is desirable to provide a memory device and a memory unit that make it possible to improve retention property of a resistance value in low-current writing.

According to an embodiment of the technology, there is provided a memory device including: a first electrode, a memory layer, and a second electrode in order, in which the memory layer includes an ion source layer containing one or more transition metal elements selected from group 4, group 5, and group 6 in periodic table, one or more chalcogen elements selected from tellurium (Te), sulfur (S), and selenium (Se), and one or both of boron (B) and carbon (C), and a resistance change layer having resistance that is varied by voltage application to the first electrode and the second electrode.

In the memory device according to the embodiment of the disclosure, when a voltage pulse or a current pulse in a "positive direction" (for example, negative potential on the first electrode side and positive potential on the second electrode side) is applied to the device in an initial state (a high resistance state), the metal element (for example, the transition metal element) contained in the ion source layer is ionized and the ionized metal element is diffused in the memory layer (for example, in the resistance change layer). Thus, a low resistance part (a conduction path) low in an oxidation state is formed to decrease the resistance of the resistance change layer (recording state). When the resistance change layer is formed of an oxide, the conduction path is formed by diffusion of the metal element in the ion source layer, or the conduction path low in the oxidation state is formed in the memory layer by movement of oxygen ions to the ion source layer to generate oxygen defect in the resistance change layer, which results in decrease of the resistance of the resistance change layer (recording state). When a voltage pulse in a "negative direction" (for example, positive potential on the first electrode side, and negative potential on the second electrode side) is applied to the device in the low resistance state, the metal ions in the resistance change layer move to the ion source layer, or the oxygen ions move from the ion source layer, which results in decrease of the oxygen defect in the conduction path. As a result, the conduction path containing the metal element disappears, and the resistance change layer is put into a high resistance state (initial state or erasing state).

According to an embodiment of the technology, there is provided a memory unit including: a plurality of memory devices each including a first electrode, a memory layer including an ion source layer, and a second electrode in order; and a pulse application section configured to selectively apply a pulse of a voltage or a current to the plurality of memory devices. The memory unit uses the memory device according to the embodiment of the technology, as each of the memory devices.

In the memory device according to the embodiment of the technology or in the memory unit according to the embodiment of the technology, adding one or both of boron (B) and carbon (C) to the ion source layer that is formed of one or more transition metal elements selected from the group 4, the group 5, and the group 6 in the periodic table and one or more chalcogen elements selected from tellurium (Te), sulfur (S), and selenium (Se) stabilizes the state of the conduction path.

In the memory device according to the embodiment of the technology or in the memory unit according to the embodiment of the technology, one or both of boron (B) and carbon (C) is used as the constituent material of the ion source layer. Therefore, it is possible to stabilize the state of the conduction path to improve the retention property of the resistance value of the resistance change layer in low current writing. Incidentally, effects described here are non-limiting. Effects achieved by the technology may be one or more of effects described in the present disclosure.

BRIEF DESCRIPTION OF DRAWINGS

FIG. 1 is a sectional diagram illustrating a structure of a memory device according to an embodiment of the disclosure.

FIG. 2 is a sectional diagram illustrating a structure of a memory cell array using the memory device of FIG. 1.

FIG. 3 is a plan view of the memory cell array as well.

FIG. 4 is a characteristic diagram illustrating variation of a conductance value before and after temperature acceleration retention test in Example 1 of the disclosure.

FIG. 5 is a characteristic diagram of a write current and retention success rate that are used as evaluation reference for experimental results (experiments 1 to 6) of the disclosure.

FIG. 6 is a characteristic diagram illustrating relationship between boron content and retention success rate in Examples of the disclosure.

FIGS. 7A, 7B, 7C, and 7D are characteristic diagrams illustrating a write current value and retention success rate in the experiment 3.

FIGS. 8A, 8B, 8C, 8D, and 8E are characteristic diagrams illustrating a write current value and retention success rate in the experiment 4.

FIG. 9 is a characteristic diagram illustrating a write current and retention success rate in the experiment 5.

FIG. 10 is a characteristic diagram illustrating a write current value and preservation success rate in the experiment 6.

FIG. 11 is a characteristic diagram of a write current and retention success rate that are used as evaluation reference for experimental results (experiments 7 to 11) of the disclosure.

FIG. 12 is a characteristic diagram illustrating relationship between a write current value and retention success rate in Examples of the disclosure.

FIG. 13 is a characteristic diagram illustrating relationship between carbon content and retention success rate in the experiment 7.

FIG. 14 is a characteristic diagram illustrating relationship between a write current value and retention success rate in the experiment 8.

FIG. 15 is a characteristic diagram illustrating relationship between a write current value and retention success rate in the experiment 11.

FIG. 16 is a characteristic diagram illustrating initial resistance distribution in experiment 13.

DESCRIPTION OF EMBODIMENTS

Hereinafter, an embodiment of the disclosure will be described in the following order with reference to drawings.
1. Embodiment 1-1. Memory device
1-2. Memory unit
2. Examples Embodiment (1-1. Memory Device)

FIG. 1 illustrates a sectional structure of a memory device 1 according to an embodiment of the disclosure. The memory device 1 includes a lower electrode 10 (a first electrode), a memory layer 20 including an ion source layer 21, and an upper electrode 30 (a second electrode) in this order.

For example, the lower electrode 10 may be provided on a silicon substrate 41 that includes a complementary metal oxide semiconductor (CMOS) circuit as will be described later (FIG. 2), and may serve as a connection part with the CMOS circuit part. The lower electrode 10 may be formed of a wiring material used in semiconductor process, such as tungsten (W), tungsten nitride (WN), copper (Cu), aluminum (Al), molybdenum (Mo), tantalum (Ta), and silicide. When the lower electrode 10 is formed of a material that may cause ion conduction in electric field, such as Cu, a surface of the lower electrode 10 made of Cu or the like may be covered with a material that causes less ion conduction and thermal diffusion, such as W, WN, titanium nitride (TiN), and tantalum nitride (TaN).

The memory layer 20 has a structure in which the ion source layer 21 and a resistance change layer 22 are stacked in order from the upper electrode 30 side. The ion source layer 21 contains an element (a movable element) that forms a conduction path in the resistance change layer 22.

The ion source layer 21 contains the above-described movable element, and is provided in contact with the upper electrode 30 in this case. The movable element is cationized or anionized by application of an electric field, and the cationaized or anionized movable element moves to the resistance change layer 22 to form the conduction path. Examples of the movable element to be cationized may include transition metal elements, in particular, elements of the group 4 (titanium (Ti), zirconium (Zr), and hafnium (Hf)), elements of the group 5 (vanadium (V), niobium (Nb), and tantalum (Ta)), and elements of the group 6 (chromium (Cr), molybdenum (Mo), and tungsten (W)) in the periodic table. Examples of the movable element to be anionized may include elements of the group 16 in the periodic table, in particular, chalcogen elements such as tellurium (Te), sulfur (S), and selenium (Se). The above-described transition metal elements are relatively chemically stable in chalcogen matrix, which enhances stability of the conduction path in a state of being in contact with the chalcogen element. The ion source layer 21 in the present embodiment contains one or two or more kinds of cationic elements and anionic elements.

Further, in the present embodiment, the ion source layer 21 contains boron (B) or carbon (C). Moreover, the ion source layer 21 may preferably contain oxygen (O) or nitrogen (N). This is because the resistance value of the ion source layer 21 is increased by containing O or N, and controllability of the resistance value (in particular, an intermediate resistance value important for multi-valuing) is accordingly improved.

In the ion source layer 21, the above-described transition metal element, the chalcogen element, and O (or N) are combined with one another to form a metal chalcogenide oxide layer. The metal chalcogenide oxide layer (or a metal chalcogenide nitride layer) mainly has amorphous structure, and serves as an ion supply source.

In the memory device 1, a resistance value of the resistance change layer 22 is varied when a predetermined voltage is applied between the lower electrode 10 and the upper electrode 30. Specifically, when a voltage is applied between the lower electrode 10 and the upper electrode 30, the above-described transition metal element moves from the ion source layer 21 to the resistance change layer 22 to form the conduction path. Alternatively, oxygen ions in the resistance change layer 22 move to the ion source layer 21 side to form a metal conduction path in the resistance change layer 22 (written state, low-resistance state).

The conduction path containing the above-described transition metal element is chemically stable as compared with other transition metal elements in the vicinity of the ion source layer 21 and in the resistance change layer 22, easily makes an intermediate oxidation state, and easily maintains the state. In addition, the conduction path by the transition metal element and in the vicinity thereof may take three states, namely, a metal state with a low resistance value, a chalcogen compound state with an intermediate resistance value, and an oxide state with a high resistance value. The resistance change layer 22 may have the stable intermediate resistance value because the resistance value of the resistance change layer 22 is determined by mixed state of these three states. In addition, retention property of the intermediate resistance value is improved because chemical stability is high in the state where the chalcogen element and the conduction path are in contact with each other.

When retention acceleration is performed in the written state, oxygen ions may be diffused from the ion source layer 21 to the resistance change layer 22, the oxygen ions are recombined with the transition metal element configuring the conduction path to increase the resistance value of the resistance change layer 22, which may result in loss of write information. Alternatively, the transition metal element configuring the conduction path is diffused to the ion source layer 21, and the resistance value of the resistance change layer 22 is accordingly increased, which may result in loss of the write information.

When B or C is used in the ion source layer 21, these elements function as follows. The loss of the write information in the memory device 1 is caused by increase of the resistance value due to recombination of the transition metal element with the above-described oxygen ions that are diffused from the ion source layer 21 to the resistance change layer 22, or is caused by diffusion of the transition metal element configuring the conduction path to the ion source layer 21. When B or C is added to the ion source layer 21, the amorphous structure configuring the ion source layer 21 is densified because the atomic radius (or ion radius) is small, and although not exactly clear, diffusion of the transition metal element configuring the conduction path and diffusion of oxygen are suppressed. Therefore, retention property of the resistance value of the resistance change layer 22 is improved. Incidentally, although the above-described effects are obtainable even when the content of B or C in the ion source layer 21 is small, the specific content of B may be preferably 3 at % or greater and 40 at % or lower. The specific content of C may be preferably 3 at % or greater and 35 at % or lower.

Note that the ion source layer 21 may contain elements other than the above-described elements, for example, manganese (Mn), cobalt (Co), iron (Fe), nickel (Ni), platinum (Pt), or silicon (Si), within a range without impairing the effects of the disclosure. As described above, the variation of the resistance value of the resistance change layer 22 is small by writing with the low current. Moreover, to achieve multi-value recording, variation in resistance value (variation in conductance value) with respect to respective gate voltages between a plurality of devices may be preferably small, and the variation of the conductance value by the gate voltage may be preferably gentle. The above-described elements may be desirable as additive elements because the above-described elements do not impair the gentle variation of the conductance value by the gate voltage.

For the same reason, the ion source layer 21 may be preferably free from copper (Cu), aluminum (Al), silver (Ag), and zinc (Zn). This is because Cu, Al, Ag, and Zn are high in mobility by voltage application and thus easily cause variation of the resistance value, and the conduction path is difficult to be maintained if Cu, Al, Ag, or Zn is contained. Incidentally, the ion source layer 21 in the present embodiment is not intended to totally eliminate content of Cu, Al, Ag, and Zn, and the ion source layer 21 in the present embodiment may contain Cu, Al, Ag, and Zn within a range without impairing the effects of the disclosure (for example, 10 at % or lower).

Moreover, the ion source layer 21 may contain a metal element whose binding energy with oxygen is lower than binding energy of oxygen with the above-described transition metal elements of the group 4, the group 5, and the group 6 of the periodic table. Examples of such a metal element may include vanadium (V), niobium (Nb), chromium (Cr), molybdenum (Mo), tungsten (W), ruthenium (Ru), palladium (Pd), platinum (Pt), nickel (Ni), and gold (Au). Specific additive amount thereof is 3 at % or greater and 10 at % or lower.

In the memory device 1 containing the transition metal element in the ion source layer 21, oxidation of the transition metal element contained in the ion source layer 21 may be accelerated by heat generated in process, annealing processing, or the like. The oxidized transition metal element forms a transition metal element oxide film between the ion source layer 21 and the resistance change layer 22, which causes extension of the pulse time associated with recording. In the present embodiment, adding a proper amount of the above-described metal element to the ion source layer 21 suppresses growth of the transition metal oxide. This is because combination of the transition metal element and the above-described metal element, or combination of the transition metal element, the above-described metal element, and oxygen is formed in the ion source layer 21. This suppresses lowering of movement of the transition metal element and oxygen in the ion source layer 21, and suppresses increase of recording pulse width. Note that the above-described metal element to be added to the ion source layer 21 may be one kind or a combination of two or more kinds as long as the additive amount thereof is 3 at % or greater and 10 at % or lower.

The resistance change layer 22 contains one or more of oxide, nitride, and oxynitride, and is provided in contact with the lower electrode 10. The resistance value of the resistance change layer 22 is varied when a predetermined voltage is applied between the lower electrode 10 and the upper electrode 30. Examples of the material of the resistance change layer 22 may include boron oxide (BOx) and silicon oxide (SiOx). Note that B (or Si) in the resistance change layer 22 is not necessarily all oxidized, and may be partially oxidized.

Moreover, the material of the resistance change layer 22 is not particularly limited as long as a layer has high resistance, for example, about several MΩ to about several hundred GΩ in an initial state, besides BOx and SiOx described above. For example, in the case where a metal oxide is used as the material of the resistance change layer 22, Zr, Hf, Al, a rare earth element, and the like that is high in resistance, namely, that may form a metal oxide having large band gap may be preferably used as a metal element. Moreover, in the case where a metal nitride is used, Zr, Hf, Al, a rare earth element, and the like may be preferably used similarly to the metal oxide, because the resistance value of about several MΩ to about several hundred GΩ is achievable and the conduction path is oxidized to easily increase resistance by movement of oxygen at the time of erasing operation. Further, likewise, in the case where a metal oxynitride is used, a metal element that may achieve a resistance value of about several MΩ to about several hundred GΩ may be desirably used.

The resistance change layer 22 may have a film thickness sufficient to achieve device resistance of several MΩ to several hundred GΩ described above, for example, may have a film thickness of about 1 nm to about 10 nm. The proper value of the film thickness is varied depending on the size of the device or the resistance value of the ion source layer 21.

The material forming the resistance change layer 22 may contain the following additive elements. Examples of the additive element may include W, Hf, C, Si, magnesium (Mg), tantalum (Ta), carbon (C), copper (Cu), nickel (Ni), zirconium (Zr), and gadolinium (Gd).

Moreover, the resistance change layer 22 is not necessarily formed aggressively. In the manufacturing process of the memory device 1, the transition metal element contained in the ion source layer 21 and oxygen are combined, and an oxide film corresponding to the resistance change layer 22 is formed on the lower electrode 10 naturally. Alternatively, an oxide film formed by application of voltage bias in an erasing direction corresponds to the resistance change layer 22.

Although a known semiconductor wiring material is used for the upper electrode 30 similarly to the lower electrode 10, a material that is stable and does not react with the ion source layer 21 even through post annealing may be preferable.

In the memory device 1 of the present embodiment, when a voltage pulse or a current pulse is applied from unillustrated power circuit (a pulse application section) through the lower electrode 10 and the upper electrode 30, electric characteristics (a resistance value) of the memory layer 20 are changed, which causes writing, erasing, and reading of information. The operation is specifically described below.

First, a positive voltage is applied to the memory device 1 having a high resistance initial state so that the upper electrode 30 may become a positive potential and the lower electrode 10 side may become a negative potential, for example. Accordingly, reduction reaction occurs on an interface between the lower electrode and the resistance change layer 22 due to cathode reaction on the lower electrode 10 side that is caused by ionization of the transition metal element in the ion source layer 21 and movement of the ionized transition metal element to the lower electrode 10 side or movement of oxygen ions from the lower electrode 10 side. As a result, a part in which oxygen defect concentration is increased or a part in which oxidation state is low is generated in the resistance change layer 22, which results in formation of the conduction path in the resistance change layer 22. In other words, the resistance value of the resistance change layer 22 becomes lower (low resistance state) than the resistance value in the initial state (high resistance state).

After that, even when the positive voltage is removed to eliminate the voltage applied to the memory device 1, the low resistance state is maintained. As a result, information is written. In the case of only once writable memory unit, namely, programmable read only memory (PROM), the recording is completed only by the above-described recording step.

On the other hand, erasing step is added in application to an erasable memory unit, namely, random access memory (RAM), electronically erasable and programmable read only memory (EEPROM), and the like. In the erasing step, a negative voltage is applied to the memory device 1 so that the upper electrode 30 may become a negative potential and the lower electrode 10 side may become a positive potential, for example. As a result, the transition metal ions are oxidized by anode reaction in the vicinity of the conduction path formed in the resistance change layer 22 (specifically, a part of the conduction path where the oxygen defect concentration configuring the conduction path is high, or a part of the conduction path where the oxidation state is low), and then the oxidized transition metal ions move to the ion source layer 21 side. Alternatively, oxygen ions move from the ion source layer 21 to the vicinity of the conduction path of the resistance change layer 22, which decreases the oxygen defect concentration of the conduction path or increases the oxidation state. As a result, the conduction path is cut off, and the resistance value of the resistance change layer 22 is changed from the low resistance state to the high resistance state.

After that, even when the negative voltage is removed to eliminate the voltage applied to the memory device 1, the high resistance state is maintained. As a result, the written information is erased. Repeating such steps allows repeat of information writing and erasing of written information in the memory device 1.

In the memory device 1 as described above, for example, when a state of the high resistance value is correlated with information of "0" and a state of the low resistance value is correlated with information of "1", it is possible to change the information of "0" to the information of "1" in the information recording step by positive voltage application, and to change the information of "1" to the information of "0" in the information erasing step by negative voltage application. Note that the operation of decreasing the resistance of the memory device is correlated with the writing operation and the operation of increasing the resistance of the memory device is correlated with the erasing operation; however, the correlation relationship may be defined inversely.

In the present embodiment, by controlling the bias voltage applied to the lower electrode 10 side or by controlling limiting resistance or the gate voltage of the MOS transistor at the time of writing, the write current is adjusted to control so-called "writing resistance", and thus the intermediate resistance value (the writing conductance value) is adjustable. Moreover, at the time of the erasing operation, by adjusting the magnitude of the bias voltage, the limiting resistance, or the current value by the gate voltage of the MOS transistor, it is possible to control the intermediate resistance value. Accordingly, a multi-value memory is achieved in addition to a binary memory.

For example, the intermediate resistance value is adjusted between the two resistance values of "0" and "1", and two levels are added to make the resistance values "00", "01", "10", and "11", which enables quaternary recording. In other words, when the voltage applied in writing and erasing is adjusted to control the intermediate resistance value, multi-value recording of two bits (quaternary), three bits (octal), or the like for one device becomes possible. As a result, the capacity of the memory device 1 is increased to twofold or threefold.

A method of manufacturing the memory device 1 according to the present embodiment is described below.

First, the lower electrode 10 made of, for example, TiN is formed on a substrate including the CMOS circuit such as a selection transistor formed thereon. After that, if necessary, an oxide or the like is eliminated from the surface of the lower electrode 10 by reverse sputtering or the like. Subsequently, for example, after a film of boron (B) is formed to have a film thickness of 2 nm on the lower electrode 10, oxidation is performed on the boron film by oxygen plasma to form a boron oxide (BOx) film to be served as the resistance change layer 22. Next, targets configured of compositions appropriate for materials of layers from the ion source layer 21 to the upper electrode 30 are used and exchanged in a sputtering apparatus to successively form the layers from the ion source layer 21 to the upper electrode 30. The electrode diameter is 50 to 300 nmϕ both inclusive. An alloy film is formed at a time with use of the targets of the constituent elements.

After formation of the upper electrode 30, a wiring layer (not illustrated) to be connected to the upper electrode 30 is formed, and a contact section to obtain common potential to all of the memory devices 1 is connected. After that, post annealing treatment is performed on stacked films. In this way, the memory device 1 illustrated in FIG. 1 is completed.

In the memory device 1, when the voltage is applied to the upper electrode 30 and the lower electrode 10 so that the upper electrode 30 and the lower electrode 10 becomes positive potential or the negative potential as described above, the conduction path is formed in the resistance change layer 22. Alternatively, in the case where the resistance change layer 22 is formed of an oxide, oxygen in the resistance change layer 22 is ionized and the ionized oxygen moves to the ion source layer 21, which results in oxygen defect in the resistance change layer 22. The resistance value of the resistance change layer 22 is accordingly lowered, and writing is performed. Next, a voltage of polarity opposite to that at the writing is applied to the upper electrode 30 and the lower electrode 10, which results in ionization of the metal element of the conduction path formed in the resistance change layer 22, and the ionized metal element moves to the ion source layer 21. Alternatively, oxygen ions move from the ion source layer 21 to the resistance change layer 22, particularly, the conduction path part. This results in decrease of the oxygen defect concentration or increase of oxidation state to cut off the conduction path. As a result, the resistance value of the resistance change layer 22 is increased to perform erasing.

As described above, in the memory device miniaturized typically, the drive current of the transistor is decreased and the drive current for writing is decreased. Therefore, the variation of the resistance value of the resistance change layer 22 is decreased. Specifically, the resistance value in the low resistance state is more increased, and a distance of the resistance values (resistance distance) between the low resistance state and the high resistance state is decreased. Therefore, resistance control of the multi-value recording becomes more difficult as the memory device is miniaturized.

Specifically, to achieve multi-value operation, control of the intermediate resistance value that is divided into four levels (two bit/cell) or eight levels (three bit/cell) is demanded in the narrow resistance distance. Therefore, to achieve multi-value recording, it is important to secure sufficient margin between a maximum drive current and a writable and holdable minimum current value. For example, when the maximum drive current of the memory device whose minimum holdable current value is 50 µA is 50 µA, multi-value recording is substantially impossible.

The maximum drive current of the memory device is determined depending on a degree of miniaturization of the process to be used or a kind of the memory device to be used. As described above, the drive current typically tends to decrease as the memory device is miniaturized. On the other hand, the minimum drive current depends on the memory layer.

In the memory device of the present embodiment, as the material of the ion source layer 21 configuring the memory layer 20, any of the transition metal elements of the group 4, the group 5, and the group 6 in the periodic table, and the chalcogen element are used, and boron (B) or carbon (C) is further used. The amorphous structure configuring the ion source layer 21 is densified because of small atomic radius (and ion radius) of B and C. Accordingly, diffusion of the transition metal element configuring the conduction path to the ion source layer 21, or diffusion of oxygen ions from the ion source layer 21 to the resistance change layer 22 is suppressed.

As described above, in the present embodiment, B or C is used as the material of the ion source layer 21. Therefore, diffusion of the transition metal element to the ion source layer 21 or diffusion of oxygen is suppressed, which improves retention property of the resistance value by the writing of the memory device 1 at the low current.

Moreover, the retention property of the write resistance value at the low current is improved, which makes it possible to retain the resistance value at a level between the low resistance state and the high resistance state of the resistance change layer 22 (intermediate resistance value). Accordingly, controllability of the intermediate resistance vale between the low resistance state and the high resistance state is improved, and thus a memory unit adapted to multi-value recording is provided.

Note that, as the constituent element of the ion source layer 21 of the present embodiment, a combination of B and C may be used. Consequently, the retention property of the resistance value by writing of the memory device 1 at the low current is further improved.

Further, a metal element whose binding energy with oxygen is lower than binding energy of oxygen with the transition metal element (specifically, Hf) of the group 4, the group 5, and the group 6 in the periodic table may be added to the ion source layer 21. Specifically, for example, 3 at % or greater and 10 at % or lower of V, Nb, Cr, Mo, W, Ru, Pd, Pt, Ni, and Au may be added to suppress increase of the recording pulse width.

(1-2. Memory Unit)

A plurality of memory devices 1 described above may be arranged in line or in matrix to configure a memory unit (a memory). At this time, as necessary, it is sufficient to connect a device-selection MOS transistor or diode to each of the memory devices 1 to configure a memory cell, and further connect the memory cell to a sense amplifier, an address decoder, a writing-erasing-reading circuit, etc. through wirings.

FIG. 2 and FIG. 3 each illustrate an example of the memory unit (a memory cell array 2) in which the plurality of memory devices 1 are arranged in matrix, where FIG. 2 illustrates a sectional configuration of the memory unit, and FIG. 3 illustrates a planar configuration of the memory unit. In the memory cell array 2, a wiring connected to the lower electrode 10 side and a wiring connected to the upper electrode 30 side are so provided as to intersect with each other with respect to each of the memory devices 1, and for example, each of the memory devices 1 is provided at the vicinity of each intersection of the wirings.

The respective memory devices 1 share the resistance change layer 22, the ion source layer 21, and the upper electrode 30. In other words, the resistance change layer 22, the ion source layer 21, and the upper electrode 30 are each configured of a layer (the same layer) common to the respective memory devices 1. The upper electrode 30 serves as a plate electrode PL common to adjacent cells.

On the other hand, the lower electrode 10 is individually provided on each memory cell to be electrically separated from adjacent cells, and the memory device 1 of each memory cell is defined at a position corresponding to each lower electrode 10. The lower electrode 10 is connected to the corresponding cell-selection MOS transistor Tr, and each of the memory devices 1 is provided above the MOS transistor Tr.

The MOS transistor Tr is configured of a gate electrode 44 and source-drain regions 43 that are formed in regions separated from each other by a device separation layer 42 in a substrate 41. A side wall insulating layer is formed on a wall surface of the gate electrode 44. The gate electrode 44 also serves as a word line WL that is one of address wirings of the memory device 1. One of the source-drain regions 43 of the MOS transistor Tr is electrically connected to the lower electrode 10 of the memory device 1 through a plug layer 45, a metal wiring layer 46, and a plug layer 47. The other of the source-drain regions 43 of the MOS transistor Tr is connected to the metal wiring layer 46 through the plug layer 45. The metal wiring layer 46 is connected to a bit line BL (see FIG. 3) that is the other of address wirings of the memory device 1. Incidentally, in FIG. 3, an active region 48 of the MOS transistor Tr is illustrated by a chain line, and a contact part 51 is connected to the lower electrode 10 of the memory device 1, and a contact part 52 is connected to the bit line BL.

In the memory cell array 2, the gate of the MOS transistor Tr is put into the ON state by the word line WL and a voltage is applied to the bit line BL, a voltage is then applied to the lower electrode 10 of the selected memory cell through the source-drain of the MOS transistor Tr. Here, when the polarity of the voltage applied to the lower electrode 10 is negative potential as compared with the potential of the upper electrode 30 (the plate electrode PL), the resistance value of the memory device 1 shifts to the low resistance state as described above. As a result, information is written to the selected memory cell. Next, when the voltage of the positive potential as compared with the potential of the upper electrode 30 (the plate electrode PL) is applied to the lower electrode 10, the resistance value of the memory device 1 shifts to the high resistance state again. As a result, information written in the selected memory cell is erased. To read out the written information, for example, a memory cell is selected by the MOS transistor Tr, and a predetermined voltage or a predetermined current is applied to the selected cell. A current or a voltage that is varied depending on the resistance state of the memory device 1 at this time is detected through the sense amplifier connected to the bit line BL or an end of the plate electrode PL, or the like. Note that the voltage or the current to be applied to the selected memory cell is made smaller than a threshold of a voltage or the like allowing the state of the resistance value of the memory device 1 to shift.

The memory unit according to the present embodiment is applicable to various kinds of memory units as described above. For example, the memory unit may be applicable to any memory type such as only once writable PROM, electrically erasable EEPROM, and so-called RAM that is writable, erasable, and readable at high speed.

2. EXAMPLES

Specific examples of the disclosure are described below.

Experiment 1

Each sample (Example 1) was fabricated with use of the above-described method of manufacturing the memory device 1. First, after the lower electrode 10 that was made of TiN incorporating a transistor in a base was cleaned by reverse sputtering, a film of B was formed to have a film thickness of 2 nm, and a film of BOx was formed by plasma oxidation to be served as the resistance change layer 22. Then, the ion source layer 21 that was formed of 50% of Hf and 50% of Te by atomic percentage ratio was subjected to reactive sputtering in process gas of argon (Ar) that was mixed with oxygen at a flow ratio of, for example, argon (sccm)/oxygen (sccm)=75/5. As a result, a film of HfTe-Ox was formed to have a film thickness of 45 nm. Subsequently, a film of W was formed to have a film thickness of 30 nm to be served as the upper electrode 30. Finally, after heat treatment was performed at 320° C. for two hours, patterning was performed to fabricate the memory device 1 (Example 1). A composition of the sample is illustrated below in order of "lower electrode/resistance change layer/ion source layer/upper electrode". Note that, in the sample, the film thickness of the resistance change layer was 2 nm, the film thickness of the ion source layer 21 was 45 nm, and the film thickness of the upper electrode 30 was 30 nm.

(Example 1) TiN/B-Ox/Hf50Te50-Ox/W

The memory cell array 2 (60 bits for each) configured of the above-described sample (Example 1) was fabricated and the writing operation was performed. Specifically, the write current was varied within a range from 2 to 35 µA by setting the write voltage to 3.8 V, setting the write pulse width to 10 µs, and adjusting the gate voltage of the MOS transistor, and the conductance value at each write current value was read out. Subsequently, temperature acceleration retention test (150° C., one hour) was performed to measure variation of the conductance value of each sample before and after the temperature acceleration retention test (hereinafter, simply referred to as retention test).

FIG. 4 illustrates distribution of the conductance values of the Example 1 before and after the retention test at the write current of 11 µA. A region surrounded by a dashed line in the figure indicates variation of the conductance value before and after the retention test, namely, indicates the variation of the resistance value within ±25%. Here, the variation of the resistance value within ±25% is regarded as retention successful example. FIG. 5 illustrates plot of retention success rate of the resistance value of the Example 1 at each write current value. Here, assuming that the current value at which the retention success rate was 60% or higher was a minimum holdable write current value (hereinafter, simply referred to as minimum current value), the minimum current value in the Example 1 was 11 µA.

Experiment 2

Next, samples (Examples 2-1 to 2-6) were fabricated through steps similar to those in the experiment 1 except that the film structure of the ion source layer 21 was changed as follows. In this experiment, the retention test (150° C., one hour) was performed after writing (write current of 11 µA), the resistance values before and after the retention test were measured, and the retention success rate for each sample was calculated. As the composition of the ion source layer 21 in each sample, Hf:Te was set to 1:1, the content of B was set to 3%, 8%, 25%, 34%, 40%, and 46% by atomic % ratio. Note that the proportion of B was measured accurately by IPC emission spectroscopic analysis method. Moreover, the film thickness of the resistance change layer 22 was 2 nm, the film thickness of the ion source layer 21 was 45 nm, and the film thickness of the upper electrode 30 was 30 nm.
(Example 2-1) TiN/B-Ox/B3Hf48.5Te48.5-Ox/W
(Example 2-2) TiN/B-Ox/B8Hf46Te46-Ox/W
(Example 2-3) TiN/B-Ox/B25Hf37.5Te37.5-Ox/W
(Example 2-4) TiN/B-Ox/B34Hf33Te33-Ox/W
(Example 2-5) TiN/B-Ox/B40Hf35Te35-Ox/W
(Example 2-6) TiN/B-Ox/B46Hf27Te27-Ox/W FIG. 6 illustrates plot of the retention success rates of the resistance values of the sample of the experiment 1 (Example 1) and the samples of this experiment (Examples 2-1 to 2-6) at the write current of 11 µA. It is found from FIG. 6 that the retention success rate was improved by addition of B to the ion source layer 21. This is because oxygen ions were difficult to diffuse to the high resistance layer 22, and combination (oxidation) of the conduction path and the oxygen ions was suppressed. However, more content of B in the ion source layer 21 is not particularly better. As illustrated in FIG. 6, in the Example 2-6 in which the content of B was 46 at %, the retention success rate was 0%. It is considered that this is because the rate of Hf or Te in the ion source layer 21 was extremely small and therefore the ion amount allowing operation, the amorphous state or the combined state of the ion source layer 21 was lost. As a result, the amount of B contained in the ion source layer 21 may be preferably 3 at % or greater and 40 at % or lower.

Experiment 3

Next, the transition metal element contained in the ion source layer 21 was changed, and the retention success rates of samples without B (Examples 3-1 to 3-4) and samples added with B (Examples 3-5 to 3-8) at each write current value were calculated. The samples (Examples 3-1 to 3-8) were fabricated through steps similar to those in the experiment 1 except that the film structure of the ion source layer 21 was changed as follows. The film structure of each sample was as follows. Note that, in each sample, the film thickness of the resistance change layer 22 was 2 nm, the film thickness of the ion source layer 21 was 45 nm, and the film thickness of the upper electrode 30 was 30 nm.
(Example 3-1) TiN/B-Ox/Zr45Te55-Ox/W
(Example 3-2) TiN/B-Ox/Ta40Te60-Ox/W
(Example 3-3) TiN/B-Ox/Cr60Te40-Ox/W
(Example 3-4) TiN/B-Ox/Cu50Te60-Ox/W
(Example 3-5) TiN/B-Ox/B10Zr40Te50-Ox/W
(Example 3-6) TiN/B-Ox/B10Ta36Te54-Ox/W
(Example 3-7) TiN/B-Ox/B10Cr54Te36-Ox/W
(Example 3-8) TiN/B-Ox/B10Cu40Te50-Ox/W FIGS. 7A, 7B, 7C, and 7D illustrate plot of the retention success rates of the Examples 3-1 and 3-5 (FIG. 7A), the Examples 3-2 and 3-6 (FIG. 7B), the Examples 3-3 and 3-7 (FIG. 7C), and the Examples 3-4 and 3-8 (FIG. 7D) at each write current value. It was found from FIGS. 7A, 7B, and 7C that even when any of elements other than Hf was used as the transition metal element contained in the ion source layer 21, improvement effect of the retention property of the resistance value by addition of B was obtainable. Note that Zr used in the Examples 3-1 and 3-5 was the element of the same group 4 in the periodic table as Hf and had element property similar to that of Hf. As actually illustrated in FIG. 7A, adding B improved the write retention property at low current similarly to the case of Hf. Therefore, although not illustrated, it is easily inferred that similar effects are obtainable even when Ti of the same group is used in place of Hf. Moreover, it is considered that when any of elements of the group 5 in the periodic table other than Ta or any of elements of the group 6 in the periodic table other than Cr is used, similar effects are obtainable.

In contrast, in the Example 3-4 in which Cu was used for the ion source layer 21, the retention property of the resistance value at low current was poor, and the retention property was not improved even in the Example 3-8 in which B was added (FIG. 7D). It is considered that this is because Cu was an element easily diffused in chalcogenide compound, and therefore the conduction path formed of Cu was easily diffused to the ion source layer 21 side and the low resistance state after writing was difficult to be maintained. Therefore, a metal element easily diffused such as Cu is not suitable as the transition metal element used for the ion source layer 21, and elements of the group 4 to the group 6 in the periodic table may be preferably used.

Experiment 4

Next, samples (Examples 3-1 to 4-10) using a plurality of transition metal elements for the ion source layer 21 were fabricated, and the retention success rates of the samples at each write current value were calculated. The samples were fabricated through steps similar to those in the experiment 1 except that the film structure of the ion source layer 21 was changed as follows. The film structure of each sample was as follows. Note that, in each sample, the film thickness of the resistance change layer 22 was 2 nm, the film thickness of the ion source layer 21 was 45 nm, and the film thickness of the upper electrode 30 was 30 nm.
(Example 4-1) TiN/B-Ox/Zr10Hf40Te50-Ox/W
(Example 4-2) TiN/B-Ox/Ta10Hf40Te50-Ox/W
(Example 4-3) TiN/B-Ox/Mo10Hf45Te45-Ox/W
(Example 4-4) TiN/B-Ox/W20Hf40Te40-Ox/W
(Example 4-5) TiN/B-Ox/Cu15Hf35Te50-Ox/W
(Example 4-6) TiN/B-Ox/B15Zr5Hf35Te45-Ox/W
(Example 4-7) TiN/B-Ox/B15Ta5Hf35Te45-Ox/W
(Example 4-8) TiN/B-Ox/B10Mo10Hf35Te45-Ox/W
(Example 4-9) TiN/B-Ox/B15W15Hf25Te45-Ox/W
(Example 4-10) TiN/B-Ox/B15Cu10Hf35Te40-Ox/W FIGS. 8A, 8B, 8C, 8D, and 8E illustrate plot of the retention success rates of the Examples 4-1 and 4-6 (FIG. 8A), the Examples 4-2 and 4-7 (FIG. 8B), the Examples 4-3 and 4-8 (FIG. 8C), the Examples 4-4 and 4-9 (FIG. 8D), and the Examples 4-5 and 4-10 (FIG. 8E) at each write current value. As illustrated in FIGS. 8A, 8B, 8C, and 8D, even when a combination of any metal element of the group 4 to group 6 in the periodic table with Hf was used, the retention property of the resistance value was improved by addition of B. Moreover, although not illustrated, it is easily inferred from combination with the results of the experiment 3 that effects of the technology are obtainable similarly by combination of the transition metal elements of the group 4 to the group 6 in the periodic table without being limited to Hf.

In contrast, it was found from FIG. 8E that when Cu was used for the ion source layer 21, the low resistance state after writing was difficult to be maintained irrespective of presence or absence of any of the metal elements of the group 4 to the group 6 in the periodic table. Accordingly, a metal element easily diffused such as Cu is not suitable for the ion source layer 21.

Experiment 5

Next, samples (Examples 5-1 and 5-2) in which oxygen (O) in the ion source layer 21 was replaced with nitrogen (N) were fabricated, and the retention success rates of the samples at each write current value were calculated. The samples were fabricated through steps similar to those in the experiment 1 except that N was used as film formation gas in place of O in formation of the ion source layer 21. Specifically, for example, in the Example 5-1, the ion source layer 21 that was formed of 50% of Hf and 50% of Te by atomic % ratio was subjected to reactive sputtering in process gas of argon (Ar) that is mixed with oxygen at a flow ratio of, for example, argon (sccm)/nitrogen (sccm)=75/5. Note that, in each sample, the film thickness of the resistance change layer 22 was 2 nm, the film thickness of the ion source layer 21 was 45 nm, and the film thickness of the upper electrode 30 was 30 nm.
(Example 5-1) TiN/B-Ox/Hf50Te50-Nx/W
(Example 5-2) TiN/B-Ox/B20Hf40Te40-Nx/W It was found from FIG. 9 that improvement effect of the retention property of the resistance value by addition of B was obtainable even when N was used for the ion source layer 21 in place of O. Note that, in this experiment, O in the ion source layer 21 was replaced with N; however, it is easily inferred that replacement is not limited thereto and effect of addition of B is obtainable even if O and N coexist.

Experiment 6

Next, samples (Examples 6-1 and 6-2) were fabricated through steps similar to those in the Example 1 except that the structure of the resistance change layer 22 was changed to SiOx. Specifically, after a film of Si was formed to have a film thickness of 2 nm on the lower electrode 10, a film of SiOx was formed by plasma oxidation to be served as the resistance change layer 22. Note that, in each sample, the film thickness of the resistance change layer 22 was 2 nm, the film thickness of the ion source layer 21 was 45 nm, and the film thickness of the upper electrode 30 was 30 nm.
(Example 6-1) TiN/Si-Ox/Hf50Te50-Nx/W
(Example 6-2) TiN/Si-Ox/B30Hf35Te35-Nx/W It was found from FIG. 10 that the retention effect of the resistance value by addition of B to the ion source layer 21 was obtainable even with use of an oxide film other than BOx for the resistance change layer 22.

Note that it is considered that the conduction path made of the transition metal is formed in the resistance change layer 22 also when the writing is performed with use of, for example, a nitride or carbide other than the oxide as the resistance change layer 22. Therefore, although not illustrated, it is inferred that even when the resistance change layer 22 is formed of a nitride, an oxynitride, or a carbide without being limited to oxide, diffusion of the conduction path is suppressed by addition of B to the ion source layer 21, and retention effect of the resistance value is obtainable.

Experiment 7

Samples (Examples 7-1 to 7-7) including C in the ion source layer 21 were fabricated with use of the above-described method of manufacturing the memory device 1. First, after the lower electrode 10 that was made of TiN incorporating a transistor in a base was cleaned by reverse sputtering, a film of B was formed to have a film thickness of 2 nm, and a film of BOx was formed by plasma oxidation to be served as the resistance change layer 22. Then, the ion source layer 21 that was formed of 44% of Hf and 56% of Te by atomic percentage ratio was subjected to reactive sputtering in process gas of argon (Ar) that was mixed with oxygen at a flow ratio of, for example, argon (sccm)/oxygen (sccm)=75/5. As a result, a film of HfTe-Ox was formed to have a film thickness of 45 nm. Subsequently, a film of W was formed to have a film thickness of 30 nm to be served as the upper electrode 30. Finally, after heat treatment was performed at 320° C. for two hours, patterning was performed to fabricate the memory device 1 (Example 7-7). Moreover, samples (Examples 7-1 to 7-6) of the memory device 1 in which C was added (at 3%, 10%, 25%, 30%, 35%, and 40% (atomic percentage ratio)) to the composition of the above-described ion source layer 21 were fabricated. The composition of each sample is illustrated below in order of "lower electrode/resistance change layer/ion source layer/upper electrode". Note that, in each sample, the film thickness of the resistance change layer was 2 nm, the film thickness of the ion source layer 21 was 45 nm, and the film thickness of the upper electrode 30 was 30 nm. Further, the composition ratio in each sample was calculated by X-ray photoelectron spectroscopy (XPS) measurement and high-frequency inductivity coupled plasma (ICP) emission analysis. In the XPS analysis, for example, Quantum 2000 X-ray photoelectron spectroscopy apparatus manufactured by ULVAC-PHI, Inc. was used, and the measurement conditions were as follows: light source: Alkα-ray (1486.6 eV), vacuum degree: $1 \times 10^{-8}$ Torr, X analysis region: 200 μmφ, and analysis depth: several nm. The sputtering conditions were as follows: weighted voltage: 1 kV 2×2 mm, and sputtering rate: 1 nm/min ($SiO_2$ reduction).
(Example 7-1) TiN/B-Ox/C3Hf42.4Te54-Ox/W
(Example 7-2) TiN/B-Ox/C10Hf39.6Te50-Ox/W
(Example 7-3) TiN/B-Ox/C25Hf33Te42-Ox/W
(Example 7-4) TiN/B-Ox/C30Hf30.8Te39.2-Ox/W
(Example 7-5) TiN/B-Ox/C35Hf28.6Te36.4-Ox/W
(Example 7-6) TiN/B-Ox/C40Hf26.4Te33.6-Ox/W
(Example 7-7) TiN/B-Ox/Hf44Te56-Ox/W The memory cell arrays 2 (60 bits for each sample) configured of each of the above-described samples (Examples 7-1 to 7-1) were fabricated, and the writing operation was performed. Specifically, the write current was varied within a range from 2 to 35 μA by setting the write voltage to 3.8 V, setting the write pulse width to 10 μs, and adjusting the gate voltage of the MOS transistor, and the conductance value at each write current value was read out. Subsequently, temperature acceleration retention test (150° C., one hour) was performed to measure variation of the conductance value of each sample before and after the temperature acceleration retention test (hereinafter, simply referred to as retention test).

FIG. 11 illustrates distribution of the conductance values of the Example 7-7 before and after the retention test at the write current of 15 μA. A region surrounded by a dashed line in the figure indicates variation of the conductance value before and after the retention test, namely, indicates the variation of the resistance value within ±10%. Here, the variation of the resistance value within ±10% is regarded as retention successful example.

Table 1 shows the retention success rates of the Examples 7-1 to 7-7 at the current values of 15 μA and 30 μA. FIG. 12 illustrates plot of the retention success rates of the respective samples at the write current of 15 μA.

TABLE 1

| | Retention Success Rate (%) | |
|---|---|---|
| | 15 μA | 30 μA |
| Example 7-1 | 28 | 43 |
| Example 7-2 | 33 | 83 |
| Example 7-3 | 36 | 85 |
| Example 7-4 | 33 | 77 |
| Example 7-5 | 27 | 32 |
| Example 7-6 | 0 | 0 |
| Example 7-7 | 24 | 23 |

As illustrated in Table 1 and FIG. 12, in the Example 7-7 in which C was not contained in the ion source layer 21, the retention success rate at the write current of 15 μA was 24%, and the retention success rate at the write current of 30 μA was 23%. In contrast, it was found that when the content of C in the ion source layer 21 was set to 3 at % or greater and 35 at % or lower, the retention success rate at the write current of 15 μA was improved as compared with the case in which the ion source layer 21 was free from C. FIG. 13 illustrates plot of the retention success rates of the resistance values of the Example 7-2 and the Example 7-7 at each write current value, and it was found that when the proper amount of C was used for the ion source layer 21, the retention success rate was substantially improved. Note that, when the content of C in the ion source layer 21 was 40 at %, the retention success rate was 0%. It is considered that this is because the rate of Hf or Te in the ion source layer 21 was decreased, and therefore the ion amount allowing operation, the amorphous state or the combined state of the ion source layer 21 was lost.

Experiment 8

Next, the transition metal element contained in the ion source layer 21 was changed, and the retention success rates of samples without C (Examples 8-1 to 8-4) and samples added with C (Examples 8-5 to 8-8) at each write current value were calculated. The samples (Examples 8-1 to 8-8) were fabricated through steps similar to those in the experiment 7 except that the film structure of the ion source layer 21 was changed as follows. The film structure of each sample was as follows. Note that, in each sample, the film thickness of the resistance change layer 22 was 2 nm, the film thickness of the ion source layer 21 was 30 nm, and the film thickness of the upper electrode 30 was 30 nm.
(Example 8-1) TiN/B-Ox/Zr40Te60-Ox/W
(Example 8-2) TiN/B-Ox/Ta40Te60-Ox/W
(Example 8-3) TiN/B-Ox/Cr60Te40-Ox/W
(Example 8-4) TiN/B-Ox/Cu50Te50-Ox/W
(Example 8-5) TiN/B-Ox/C10Zr35Te54-Ox/W
(Example 8-6) TiN/B-Ox/C10Ta36Te54-Ox/W
(Example 8-7) TiN/B-Ox/C10Cr54Te36-Ox/W
(Example 8-8) TiN/B-Ox/C10Cu45Te45-Ox/W Table 2 shows the retention success rates of the Examples 8-1 to 8-8 at the write current values of 15 μA and 30 μA.

It was found from Table 2 that even when an element other than Hf was used for the transition metal element contained in the ion source layer 21, improvement effect of the retention property of the resistance value by addition of C was obtainable. Note that Zr used in the Examples 8-1 and 8-5 was the element of the same group 4 in the periodic table as Hf, and adding C improved the write retention property at the low current similarly to the case of Hf. Therefore, although not illustrated here, it is easily inferred that effects similar to those in the present Example are obtainable even when an element of the group 4 in the periodic table other than Hf and Zr, an element of the group 5 other than Ta, or an element of the group 6 other than Cr is used.

TABLE 2

| | Retention Success Rate (%) | |
|---|---|---|
| | 15 μA | 30 μA |
| Example 8-1 | 18 | 43 |
| Example 8-2 | 25 | 52 |
| Example 8-3 | 13 | 37 |
| Example 8-4 | 0 | 0 |
| Example 8-5 | 27 | 73 |
| Example 8-6 | 25 | 83 |
| Example 8-7 | 20 | 60 |
| Example 8-8 | 0 | 0 |

Experiment 9

Next, samples (Examples 9-1 to 9-4) in which a plurality of transition metal elements were used in the ion source layer 21 were fabricated, and the retention success rates of the samples at each write current were calculated. The samples were fabricated through steps similar to those in the experiment 7 except that the film structure of the ion source layer 21 was changed as follows. The film structure of each sample was as follows. Note that, in each sample, the film thickness of the resistance change layer 22 was 2 nm, the film thickness of the ion source layer 21 was 30 nm, and the film thickness of the upper electrode 30 was 30 nm.
(Example 9-1) TiN/B-Ox/Ta10Hf40Te50-Ox/W
(Example 9-2) TiN/B-Ox/Cu15Hf35Te50-Ox/W
(Example 9-3) TiN/B-Ox/C15Ta5Hf35Te45-Ox/W
(Example 9-4) TiN/B-Ox/C15Cu10Hf35-Te40-Ox/W Table 3 shows the retention success rates (%) of the Examples 9-1 to 9-4 at the write current values of 15 μA and 30 μA. As illustrated in Table 3, even when other transition metal element (here, Ta) of the group 4 to the group 6 in the periodic table was combined with Hf, the retention property of the resistance value was improved by addition of C.

However, when Cu was used for the ion source layer 21, the retention success rate was noticeably low. FIG. 14 illustrates plot of the retention success rates of the Examples 8-4 and 8-8 in which Cu was used for the ion source layer 21 similarly to the above-described examples 9-2 and 9-4, at each write current value. In this way, it was found that, when the Cu was added to the ion source layer 21, it was difficult to maintain the low resistance state after writing at the low write current equal to or lower than 30 μA irrespective of presence or absence of the transition metal element of the group 4 to the group 6 in the periodic table and C. Therefore, even when C is used for the ion source layer 21, the metal element easily diffused such as Cu is not suitable.

TABLE 3

| | Retention Success Rate (%) | |
|---|---|---|
| | 15 µA | 30 µA |
| Example 9-1 | 22 | 58 |
| Example 9-2 | 2 | 0 |
| Example 9-3 | 37 | 77 |
| Example 9-4 | 0 | 0 |

Experiment 10

Next, samples (Examples 10-1 to 10-4) were fabricated through steps similar to those in the experiment 7 except that the structure of the resistance change layer 22 was changed to SiOx (or SiNx). Specifically, after a film of Si was formed to have a film thickness of 2 nm on the lower electrode 10, oxidation (or nitriding) was performed by $O_2$ plasma (or $N_2$ plasma) to form a film of SiOx (or SiNx) to be served as the resistance change layer 22. Note that, in each sample, the film thickness of the resistance change layer 22 was 2 nm, the film thickness of the ion source layer 21 was 30 nm, and the film thickness of the upper electrode 30 was 30 nm.
(Example 10-1) TiN/Si-Ox/Hf50Te50-Ox/W
(Example 10-2) TiN/Si-Ox/C30Hf35Te35-Ox/W
(Example 10-3) TiN/Si-Nx/Hf50Te50-Ox/W
(Example 10-4) TiN/Si-Nx/C30Hf35Te35-Ox/W Table 4 shows the retention success rates (%) of the Examples 10-1 to 10-4 at the write current values of 15 µA and 30 µA. It was found from the results of the Examples 10-1 and 10-2 that even when an oxide film other than BOx was used, the retention effect of the resistance value by addition of C to the ion source layer 21 was obtainable. In addition, it was found from the results of the Examples 10-3 and 10-4 that, in the memory device 1 of the disclosure, even when the resistance change layer 22 was made of a nitride, the retention effect of the resistance value was obtainable by addition of C to the ion source layer 21 similarly to the case where the resistance change layer 22 is made of an oxide. Incidentally, although not illustrated here, it is easily inferred that similar effects are obtainable even when the resistance change layer 22 is formed of a material other than oxide and nitride such as Si and B, for example, C.

TABLE 4

| | Retention Success Rate (%) | |
|---|---|---|
| | 15 µA | 30 µA |
| Example 10-1 | 17 | 50 |
| Example 10-2 | 33 | 78 |
| Example 10-3 | 15 | 47 |
| Example 10-4 | 33 | 70 |

Experiment 11

Next, a sample of Example 11-1 in which the ion source layer 21 was formed of BHfTe and a sample of Example 11-2 in which the ion source layer 21 was formed of CBHfTe were fabricated, and the retention success rates thereof at each write current value were calculated. The samples (the Examples 11-1 and 11-2) were fabricated through steps similar to those in the experiment 7 except that the film structure of the ion source layer 21 was changed as follows. The film structure of each sample was as follows. Note that, in each sample, the film thickness of the resistance change layer 22 was 2 nm, the film thickness of the ion source layer 21 was 45 nm, and the film thickness of the upper electrode 30 was 30 nm.
(Example 11-1) TiN/B-Ox/B10Hf40Te50-Ox/W
(Example 11-2) TiN/B-Ox/C4B16Hf35Te45-Ox/W FIG. 15 illustrates plot of the retention success rates of the Examples 11-1 and 11-2 at each write current value. As illustrated in FIG. 15, it was found that adding C (the Example 11-2) to the ion source layer 21 (the Example 11-1) containing B similarly to the above-described experiments 1 to 6 further improved the retention success rate. In other words, using a combination of B and C for the ion source layer 21 made it possible to further improve the retention property of the resistance value. In addition, it is easily inferred that effects of the technology are obtainable by adding other element (for example, B or N) as long as the added amount of the other element is within a range not preventing densification of the film structure of the ion source layer 21 by addition of C.

Experiment 12

Next, samples (Examples 12-1 to 12-4) in which the ion source layer 21 was configured as follows were fabricated, and recordable minimum pulse times of the samples at the write current value of 30 µA under each annealing condition were measured. Specifically, after the samples were fabricated at the annealing temperature of 320° C. (or 425° C.), the write voltage of 3.8 V was applied while a gate voltage of the transistor was fixed to a value at which the write current value in recording become 30 µA and the pulse time was changed, and the recordable minimum pulse time was measured. The minimum pulse time used here indicates a time necessary for the change of the resistance value of the memory device 1 to $\frac{1}{10}$ or lower of the resistance value in the initial state. The film structure of each sample was as follows. Note that, in each sample, the film thickness of the resistance change layer 22 was 1.75 nm, the film thickness of the ion source layer 21 was 45 nm, and the film thickness of the upper electrode 30 was 30 nm.
(Example 12-1) TiN/BC-Ox/Mo5B12C3Hf35Te45-Ox/W
(Example 12-2) TiN/BC-Ox/Pt5B12C3Hf35Te45-Ox/W
(Example 12-3) TiN/BC-Ox/Ni5B12C3Hf35Te45-Ox/W
(Example 12-4) TiN/BC-Ox/B16C4Hf35Te45-Ox/W Table 5 shows the recordable minimum pulse times (µs) of the Examples 12-1 to 12-4 after annealing (at 320° C. or 425° C.). As illustrated in Table 5, in the Example 12-4 (a comparative example), the minimum pulse time in the case where the annealing was performed at high temperature (425° C.) was substantially increased as compared with the case where the annealing was performed at 320° C. In the Example 12-4, a metal element whose binding energy with oxygen is lower than the binding energy of oxygen with the transition metal element (here, Hf) contained in the ion source layer 21, such as Mo and Pt was not contained. Therefore, it is considered that a layer of the transition metal oxide was formed between the ion source layer 21 and the resistance change layer 22 by exposure at the high temperature condition, which inhibited movement of the transition metal element and oxygen to the resistance change layer 22. Extension of the minimum pulse time indicated lowering of the recording speed, and thus it was inferred that the memory operation of the memory device 1 was largely delayed. In contrast, in the Examples 12-1 to 12-3 in which any of Mo, Pt, and Ni was added to the ion source layer 21, the pulse time was less changed due to the annealing temperature, and the recordable minimum pulse time was further shortened.

TABLE 5

| | Minimum Pulse Time (μS) Annealing Condition | |
|---|---|---|
| | 320° C./2 hours | 425° C./2 hours |
| Example 12-1 | 2 | 1 |
| Example 12-2 | 10 | 10 |
| Example 12-3 | 3 | 10 |
| Example 12-4 | 100 | 2000 |

Experiment 13

Next, samples (Examples 13-1 to 13-7) in which Mo was added to the ion source layer 21 were fabricated, and recordable minimum pulse times of the samples at the write current value of 30 μA under each annealing condition were measured. Specifically, after the samples were fabricated at the annealing temperature of 320° C. (or 425° C.), the write voltage 3.8 V was applied while a gate voltage of the transistor was fixed to a value at which the write current in recording become 30 μA and the pulse time was changed, and the recordable minimum pulse time was measured.

(Example 13-1) TiN/BC-Ox/B12.6C3.2Hf36.8Te47.4-Ox/W (Example 13-2) TiN/BC-Ox/Mo3B12.3C3.1Hf35.7Te45.9-Ox/W (Example 13-3) TiN/BC-Ox/Mo5B12C3Hf35Te45-Ox/W (Example 13-4) TiN/BC-Ox/Mo8B11.6C2.9Hf33.9Te43.6-Ox/W (Example 13-5) TiN/BC-Ox/Mo10B11.4C2.8Hf33.2Te42.6-Ox/W (Example 13-6) TiN/BC-Ox/Mo12B11.1C2.8Hf32.4Te41.7-Ox/W (Example 13-7) TiN/BC-Ox/Mo13.5B10.9C2.7Hf31.9Te41.0-Ox/W Table 6 shows the recordable minimum pulse times (μS) of the Examples 13-1 to 13-7 after annealing (at 320° C. or 425° C.). As illustrated in Table 6, in the case where Mo was not added (0 at %, Example 13-1), the minimum pulse time was largely increased when the annealing temperature was set to high temperature (425° C.). In contrast, in the case where 3 at % to 10 at % of Mo was added to the ion source layer 21, increase of the minimum pulse time by increasing of the annealing temperature was suppressed, and a value equivalent to the value in the case of low temperature (320° C.) was obtained. However, when the additive amount of Mo was excessively large (for example, 12 at % or greater), peeling of the film occurs in high temperature annealing. In addition, as illustrated in FIG. 16, the initial resistance values were largely distributed from lower part to higher part, which disadvantageously decreased the range of the recordable conductance value. From the above, it was found that the preferable additive amount of Mo to the ion source layer 21 was 3 at % or greater and 10 at % or lower.

TABLE 6

| | Additive Amount of Mo (at %) | Minimum Pulse Time (μS) Annealing Condition | |
|---|---|---|---|
| | | 320° C./2 hours | 425° C./2 hours |
| Example 13-1 | 0 | 100 | 2000 |
| Example 13-2 | 3 | 30 | 30 |
| Example 13-3 | 5 | 2 | 1 |
| Example 13-4 | 8 | 0.01 | 0.01 |
| Example 13-5 | 10 | 0.002 | 0.002 |
| Example 13-6 | 12 | 2 | Film Peeling |
| Example 13-7 | 13.5 | 1 | Film Peeling, Poor Initial Resistance Distribution |

Incidentally, although not illustrated here, even when an element (for example, Pt, Ni, or the like described above) other than Mo was added, it was possible to suppress increase of the minimum pulse time caused by increase of the annealing temperature as long as the additive amount of the element was within the range (3 at % or greater and 10 at % or lower) similar to that of Mo.

Hereinbefore, although the disclosure has been described with referring to the embodiment and the Examples, the disclosure is not limited to the above-described embodiment and the like, and various modifications may be made.

For example, in the above-described embodiment and Examples, the structures of the memory device 1 and the memory cell array 2 have been specifically described. However, all of the layers are not necessarily provided, and other layers may be further provided. Moreover, the material, the film formation method, the film formation condition, and the like of each layer described in the above-described embodiment and the like are not limited, and other materials or other film formation methods may be used. For example, an element other than those described above may be used for the ion source layer 21 within a range meeting the above-described composition ratio and desired characteristics for the multi-value memory.

Further, the memory device 1 according to the above-described embodiment may have an inverse structure in which the position of the ion source layer 21 and the position of the resistance change layer 22 are laterally interchanged. To increase a memory capacity, the memory device 1 according to the above-described embodiment may have a cross point structure/system that is combined with an appropriate diode, and memory devices may be stacked in a vertical direction. Thus, the memory device 1 is applicable to various kinds of known memory structures.

Note that the effects described in the present specification are illustrative and non-limiting. Effects achieved by the technology may be effects other than those described above. Note that the technology may be configured as follows.

(1) A memory device including:
 a first electrode, a memory layer, and a second electrode in order, wherein the memory layer includes
  an ion source layer containing one or more transition metal elements selected from group 4, group 5, and group 6 in periodic table, one or more chalcogen elements selected from tellurium (Te), sulfur (S), and selenium (Se), and one or both of boron (B) and carbon (C), and
  a resistance change layer having resistance that is varied by voltage application to the first electrode and the second electrode.

(2) The memory device according to (1), wherein a content of boron (B) contained in the ion source layer is 3 at % or greater and 40 at % or lower.

(3) The memory device according to (1) or (2), wherein a content of carbon (C) contained in the ion source layer is 3 at % or greater and 35 at % or lower.

(4) The memory device according to any one of (1) to (3), wherein the ion source layer contains boron (B) and carbon (C).

(5) The memory device according to any one of (1) to (4), wherein the ion source layer contains oxygen (O).

(6) The memory device according to any one of (1) to (5), wherein the ion source layer contains nitrogen (N).

(7) The memory device according to any one of (1) to (6), wherein the ion source layer is free from copper (Cu).

(8) The memory device according to any one of (1) to (7), wherein the ion source layer contains any of manganese (Mn), cobalt (Co), iron (Fe), nickel (Ni), platinum (Pt), and silicon (Si).

(9) The memory device according to any one of (1) to (8), wherein the ion source layer contains a metal element having binding energy with oxygen lower than binding energy of the transition metal element with oxygen, the metal element suppressing formation of an oxide of the transition metal.

(10) The memory device according to (9), wherein the metal element is one or more of molybdenum (Mo), platinum (Pt), and nickel (Ni).

(11) The memory device according to (9) or (10), wherein a content of the metal element contained in the ion source layer is 3 at % or greater and 10 at % or lower.

(12) The memory device according to any one of (1) to (11), wherein the transition metal element contained in the ion source layer is hafnium (Hf).

(13) The memory device according to any one of (1) to (12), wherein the resistance change layer contains one or more of oxygen (O), nitrogen (N), carbon (C), and boron (B).

(14) The memory device according to any one of (1) to (13), wherein the resistance change layer is formed of one of an oxide, a nitride, and an oxynitride.

(15) The memory device according to any one of (1) to (14), wherein the resistance change layer contains an oxide, a nitride, or an oxynitride of any of zirconium (Zr), hafnium (Hf), aluminum (Al), and rare earth elements.

(16) The memory device according to any one of (1) to (15), wherein a resistance value is varied by formation of a low resistance part containing the transition metal element, the low resistance part being formed in the resistance change layer by voltage application to the first electrode and the second electrode.

(17) The memory device according to any one of (1) to (16), wherein a resistance value is varied by formation of a low resistance part including oxygen defect, the low resistance part being formed in the resistance change layer by voltage application to the first electrode and the second electrode.

(18) A memory unit including:
a plurality of memory devices each including a first electrode, a memory layer, and a second electrode in order; and
a pulse application section configured to selectively apply a pulse of a voltage or a current to the plurality of memory devices, wherein
the memory layer includes
an ion source layer containing one or more transition metal elements selected from group 4, group 5, and group 6 in periodic table, one or more chalcogen elements selected from tellurium (Te), sulfur (S), and selenium (Se), and one or both of boron (B) and carbon (C), and
a resistance change layer having resistance that is varied by voltage application to the first electrode and the second electrode.

This application is based upon and claims the benefit of priority of the Japanese Patent Application No. 2012-281395, filed on Dec. 25, 2012, the Japanese Patent Application No. 2013-156038, filed on Jul. 26, 2013, and the Japanese Patent Application No. 2013-229393, filed on Nov. 5, 2013, all filed with the Japan Patent Office, the entire contents of these applications are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A memory device, comprising:
a first electrode, a memory layer, and a second electrode, wherein
the memory layer is between the first electrode and the second electrode, and
the second electrode comprises copper (Cu); and
a first material that covers a surface of the second electrode, wherein
the first material includes tantalum nitride (TaN), and
the memory layer includes:
an ion source layer in contact with the first electrode, wherein the ion source layer is free from copper (Cu), aluminum (Al),
silver (Ag), and zinc (Zn), and
the ion source layer contains:
at least one transition metal element selected from at least one of group 4, group 5, or group 6 in a periodic table,
at least one chalcogen element selected from tellurium (Te), sulfur (S), and selenium (Se), and
at least one of boron (B) or carbon (C); and
a resistance change layer, wherein
a resistance value of the resistance change layer is variable based on application of a voltage to the first electrode and the second electrode, and
the resistance change layer includes boron oxide (BOx) and silicon oxide (SiOx).

2. The memory device according to claim 1, wherein the resistance change layer is in contact with the second electrode.

3. The memory device according to claim 1, wherein the resistance change layer further contains at least one of oxygen (O), nitrogen (N), boron (B), or carbon (C).

4. The memory device according to claim 1, wherein the resistance change layer further contains an oxide, an oxynitride, and a nitride of at least one of zirconium (Zr), hafnium (Hf), aluminum (Al), or rare earth elements.

5. The memory device according to claim 1, wherein
a change in the resistance value of the resistance change layer is based on a variation in an oxygen defect concentration in a low resistance part of the resistance change layer, and the variation in the oxygen defect concentration in the low resistance part of the resistance change layer is based on the application of the voltage to the first electrode and the second electrode.

6. The memory device according to claim 1, wherein the ion source layer further contains an element that forms a conduction path in the resistance change layer.

7. The memory device according to claim 1, wherein a film thickness of the first electrode is 30 nm.

8. The memory device according to claim 1, wherein a content of the carbon (C) in the ion source layer is 3 at % or greater and 35 at % or lower.

9. The memory device according to claim 1, wherein the ion source layer further contains oxygen (O).

10. The memory device according to claim 1, wherein the ion source layer further contains one of manganese (Mn), cobalt (Co), iron (Fe), nickel (Ni), platinum (Pt), or silicon (Si).

11. The memory device according to claim 1, wherein the ion source layer further contains at least one of titanium (Ti), zirconium (Zr), or hafnium (Hf).

12. The memory device according to claim 1, wherein the ion source layer further contains at least one of vanadium (V), niobium (Nb), or tantalum (Ta).

13. The memory device according to claim 1, wherein the ion source layer further contains at least one of chromium (Cr), molybdenum (Mo), and tungsten (W).

14. A memory unit, comprising:
a plurality of memory devices, wherein
each memory device of the plurality of memory devices includes:
a first electrode, a memory layer, and a second electrode, wherein
the memory layer is between the first electrode and the second electrode, and
the second electrode comprises copper (Cu); and
a first material that covers a surface of the second electrode, wherein
the first material includes tantalum nitride (TaN); and
a pulse application section configured to selectively apply a pulse of one of a voltage or a current to the plurality of memory devices, wherein the memory layer includes:
an ion source layer in contact with the first electrode, wherein
the ion source layer is free from copper (Cu), aluminum (Al), silver (Ag), and zinc (Zn), and
the ion source layer contains:
at least one of boron (B) or carbon (C),
at least one transition metal element selected from at least one of group 4, group 5, or group 6 in a periodic table, and
at least one chalcogen element selected from tellurium (Te), sulfur (S), and selenium (Se); and
a resistance change layer, wherein
a resistance value of the resistance change layer is variable based on the application of the pulse, and
the resistance change layer includes boron oxide (BOx) and silicon oxide (SiOx).

* * * * *